(12) United States Patent
Tran

(10) Patent No.: US 8,426,118 B2
(45) Date of Patent: Apr. 23, 2013

(54) METHOD OF FORMING PITCH MULTIPLIED CONTACTS

(75) Inventor: Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/894,633

(22) Filed: Sep. 30, 2010

(65) Prior Publication Data

US 2011/0014574 A1   Jan. 20, 2011

Related U.S. Application Data

(63) Continuation of application No. 11/215,982, filed on Aug. 31, 2005, now Pat. No. 7,829,262.

(51) Int. Cl.
  *G03F 7/20* (2006.01)
(52) U.S. Cl.
  USPC ............................................. 430/317
(58) Field of Classification Search ........... 430/311, 430/313, 317, 319, 314
  See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,648,937 A | 3/1987 | Ogura et al. | |
| 4,716,131 A | 12/1987 | Okazawa et al. | |
| 4,776,922 A | 10/1988 | Bhattacharyya et al. | |
| 4,803,181 A | 2/1989 | Buchmann et al. | |
| 4,838,991 A | 6/1989 | Cote et al. | |
| 5,013,680 A | 5/1991 | Lowrey et al. | |
| 5,047,117 A | 9/1991 | Roberts | |
| 5,053,105 A | 10/1991 | Fox, III | |
| 5,117,027 A | 5/1992 | Bernhardt et al. | |
| 5,328,810 A * | 7/1994 | Lowrey et al. | 430/313 |
| 5,330,879 A | 7/1994 | Dennison | |
| 5,470,661 A | 11/1995 | Bailey et al. | |
| 5,514,885 A | 5/1996 | Myrick | |

(Continued)

FOREIGN PATENT DOCUMENTS

| | | |
|---|---|---|
| DE | 42 36 609 A1 | 5/1994 |
| EP | 0 227 303 A2 | 7/1987 |

(Continued)

OTHER PUBLICATIONS

Bergeron, et al. "Resolution Enhancement Techniques for the 90 nm Technology Node and Beyond," Future Fab International, Issue 15, Jul. 11, 2003, 4 pages.

(Continued)

*Primary Examiner* — Brittany Raymond
(74) *Attorney, Agent, or Firm* — Knobbe, Martens, Olson & Bear LLP

(57) ABSTRACT

Methods of forming electrically conductive and/or semiconductive features for use in integrated circuits are disclosed. Various pattern transfer and etching steps can be used, in combination with pitch-reduction techniques, to create densely-packed features. The features can have a reduced pitch in one direction and a wider pitch in another direction. Conventional photo-lithography steps can be used in combination with pitch-reduction techniques to form elongate, pitch-reduced features such as bit-line contacts, for example.

20 Claims, 24 Drawing Sheets

U.S. PATENT DOCUMENTS

| | | | |
|---|---|---|---|
| 5,593,813 A | 1/1997 | Kim |
| 5,670,794 A | 9/1997 | Manning |
| 5,753,546 A | 5/1998 | Koh et al. |
| 5,789,320 A | 8/1998 | Andricacos et al. |
| 5,795,830 A | 8/1998 | Cronin et al. |
| 5,830,332 A | 11/1998 | Babich et al. |
| 5,858,620 A | 1/1999 | Ishibashi et al. |
| 5,899,746 A | 5/1999 | Mukai |
| 5,998,256 A | 12/1999 | Juengling |
| 6,004,862 A | 12/1999 | Kim et al. |
| 6,010,946 A | 1/2000 | Hisamune et al. |
| 6,020,255 A | 2/2000 | Tsai et al. |
| 6,042,998 A | 3/2000 | Brueck et al. |
| 6,057,573 A | 5/2000 | Kirsch et al. |
| 6,060,383 A | 5/2000 | Nogami et al. |
| 6,063,688 A | 5/2000 | Doyle et al. |
| 6,071,789 A | 6/2000 | Yang et al. |
| 6,110,837 A | 8/2000 | Linliu et al. |
| 6,143,476 A | 11/2000 | Ye et al. |
| 6,207,490 B1 | 3/2001 | Lee |
| 6,211,044 B1 | 4/2001 | Xiang et al. |
| 6,288,454 B1 | 9/2001 | Allman et al. |
| 6,291,334 B1 | 9/2001 | Somekh |
| 6,297,554 B1 | 10/2001 | Lin |
| 6,335,257 B1 | 1/2002 | Tseng |
| 6,346,724 B1 * | 2/2002 | Lee .................. 257/306 |
| 6,348,380 B1 | 2/2002 | Weimer et al. |
| 6,362,057 B1 | 3/2002 | Taylor, Jr. et al. |
| 6,372,649 B1 | 4/2002 | Han et al. |
| 6,383,907 B1 | 5/2002 | Hasegawa et al. |
| 6,395,613 B1 | 5/2002 | Juengling |
| 6,423,474 B1 | 7/2002 | Holscher |
| 6,455,372 B1 | 9/2002 | Weimer |
| 6,500,756 B1 | 12/2002 | Bell et al. |
| 6,514,884 B2 | 2/2003 | Maeda |
| 6,522,584 B1 | 2/2003 | Chen et al. |
| 6,531,067 B1 | 3/2003 | Shiokawa et al. |
| 6,534,243 B1 | 3/2003 | Templeton |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,620,715 B1 | 9/2003 | Blosse et al. |
| 6,632,741 B1 | 10/2003 | Clevenger et al. |
| 6,638,441 B2 | 10/2003 | Chang et al. |
| 6,664,154 B1 * | 12/2003 | Bell et al. .................. 438/197 |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,730,571 B1 | 5/2004 | Chan et al. |
| 6,734,107 B2 | 5/2004 | Lai et al. |
| 6,744,094 B2 | 6/2004 | Forbes |
| 6,762,449 B2 | 7/2004 | Uchiyama et al. |
| 6,773,998 B1 | 8/2004 | Fisher et al. |
| 6,794,699 B2 | 9/2004 | Bissey et al. |
| 6,800,930 B2 | 10/2004 | Jackson et al. |
| 6,818,141 B1 | 11/2004 | Plat et al. |
| 6,835,662 B1 | 12/2004 | Erhardt et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,916,594 B2 | 7/2005 | Bok |
| 6,924,191 B2 | 8/2005 | Liu et al. |
| 6,955,961 B1 | 10/2005 | Chung |
| 6,962,867 B2 | 11/2005 | Jackson et al. |
| 7,015,124 B1 | 3/2006 | Fisher et al. |
| 7,074,668 B1 | 7/2006 | Park et al. |
| 7,183,205 B2 | 2/2007 | Hong |
| 7,183,597 B2 | 2/2007 | Doyle |
| 7,202,174 B1 | 4/2007 | Jung |
| 7,208,379 B2 | 4/2007 | Venugopal et al. |
| 7,271,107 B2 | 9/2007 | Marks et al. |
| 7,288,445 B2 | 10/2007 | Bryant et al. |
| 7,291,560 B2 | 11/2007 | Parascandola et al. |
| 7,378,727 B2 | 5/2008 | Caspary et al. |
| 7,442,976 B2 | 10/2008 | Juengling |
| 7,537,866 B2 | 5/2009 | Liu |
| 7,851,135 B2 | 12/2010 | Jung |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0094688 A1 | 7/2002 | Mitsuiki |
| 2002/0127810 A1 | 9/2002 | Nakamura et al. |
| 2003/0006410 A1 * | 1/2003 | Doyle ............................. 257/20 |
| 2003/0044722 A1 | 3/2003 | Hsu et al. |
| 2003/0090002 A1 | 5/2003 | Sugawara et al. |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0199169 A1 * | 10/2003 | Jun et al. ....................... 438/694 |
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka et al. |
| 2004/0245547 A1 | 12/2004 | Stipe |
| 2005/0074949 A1 | 4/2005 | Jung et al. |
| 2005/0087892 A1 * | 4/2005 | Hsu et al. ....................... 257/909 |
| 2005/0112886 A1 | 5/2005 | Asakawa et al. |
| 2005/0142497 A1 | 6/2005 | Ryou |
| 2005/0153562 A1 | 7/2005 | Furukawa et al. |
| 2005/0164454 A1 | 7/2005 | Leslie |
| 2005/0167394 A1 | 8/2005 | Liu et al. |
| 2005/0186705 A1 | 8/2005 | Jackson et al. |
| 2005/0215039 A1 | 9/2005 | Hill et al. |
| 2005/0272259 A1 | 12/2005 | Hong |
| 2006/0003182 A1 | 1/2006 | Lane et al. |
| 2006/0011947 A1 | 1/2006 | Juengling |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0105568 A1 | 5/2006 | Shen et al. |
| 2006/0115978 A1 | 6/2006 | Specht |
| 2006/0172540 A1 | 8/2006 | Marks et al. |
| 2006/0189150 A1 | 8/2006 | Jung |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0250593 A1 | 11/2006 | Nishii |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0026672 A1 | 2/2007 | Tang et al. |
| 2007/0045712 A1 | 3/2007 | Haller et al. |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0077524 A1 | 4/2007 | Koh |
| 2007/0210449 A1 | 9/2007 | Caspary et al. |
| 2007/0215874 A1 | 9/2007 | Furukawa et al. |

| | | | |
|---|---|---|---|
| 2007/0215960 A1 | 9/2007 | Zhu et al. | |
| 2007/0275309 A1 | 11/2007 | Liu | |
| 2008/0054350 A1 | 3/2008 | Breitwisch et al. | |
| 2008/0292991 A1 | 11/2008 | Wallow | |

FOREIGN PATENT DOCUMENTS

| | | |
|---|---|---|
| EP | 0 491 408 A2 | 6/1992 |
| EP | 1 357 433 A2 | 10/2003 |
| JP | 57-048237 | 3/1982 |
| JP | 64-035916 | 2/1989 |
| JP | 05-343370 | 12/1993 |
| JP | H08-55908 | 2/1996 |
| JP | H08-55920 | 2/1996 |
| JP | 10-116907 | 5/1998 |
| JP | 2000-208434 | 7/2000 |
| JP | 2000-357736 | 12/2000 |
| JP | 2004-014783 | 1/2004 |
| JP | 2004-080033 | 3/2004 |
| JP | 2004-140212 | 5/2004 |
| JP | 2004-152784 | 5/2004 |
| JP | 2005-150333 | 6/2005 |
| JP | 2006-351861 | 12/2006 |
| JP | 2006-351861 | 1/2012 |
| KR | 10-1999-0001440 | 1/1999 |
| KR | 1999-027887 | 4/1999 |
| TW | 376582 | 12/1999 |
| WO | WO 94/15261 | 7/1994 |
| WO | WO 02/099864 A1 | 12/2002 |
| WO | WO 2004/001799 A2 | 12/2003 |
| WO | WO 2004/003977 | 1/2004 |
| WO | WO 2005/034215 A1 | 4/2005 |
| WO | WO 2006/026699 | 3/2006 |

OTHER PUBLICATIONS

Bhave et al. "Developer-soluble Gap fill materials for patterning metal trenches in Via-first Dual Damascene process," preprint of Proceedings of SPIE: Advances in Resist Technology and Processing XXI, vol. 5376, 2004, John L. Sturtevant, editor, 8 pages.

Bruek, "Optical and Interferometric Lithography—Nanotechnology Enablers," 2005, Proceedings of the IEEE, vol. 93, No. 10, pp. 1704-1721.

Choi et al. "Sublithographic nanofabrication technology for nanocatalysts and DNA chips," *J. Vac. Sci. Technol.*, Nov./Dec. 2003; pp. 2951-2955.

Chung et al., "Nanoscale Multi-Line Patterning Using Sidewall Structure," Jpn., J. App.. Phys. vol. 41 (2002) Pt. 1, No. 6B, pp. 4410-4414.

Chung et al., "Pattern multiplication method and the uniformity of nanoscale multiple lines*," J.Vac.Sci.Technol. B21(4), Jul./Aug. 2003, pp. 1491-1495.

U.S. Appl. No. 11/543,515, filed Oct. 24, 2006.

*Ex parte* Cantell, unpublished decision of the Board of Patent Appeals and Interferences, Mar. 4, 2005.

Joubert et al. "Nanometer scale linewidth control during etching of polysilicon gates in high-density plasmas," Microelectronic Engineering 69 (2003), pp. 350-357.

Oehrlein et al. "Pattern transfer into low dielectic materials by high-density plasma etching," Solid State Tech., May 2000, 8 pages.

Office Action of Jun. 2, 2008 in U.S. Appl. No. 11/219,067, filed Sep. 1, 2005.

Office Action of Jun. 5, 2008 in U.S. Appl. No. 11/514,117, filed Aug. 30, 2006.

Office Action of Jul. 11, 2008 in U.S. Appl. No. 11/367,020, filed Mar. 2, 2006.

Sheats et al., "Microlithography: Science and Technology," 1998, Marcel Dekkar, Inc., pp. 104-105.

Japanese Notice of Rejection Grounds dated Sep. 13, 2011 in corresponding Japanese Patent Application No. 2008-529144.

Korean Notice of Preliminary Rejection dated Sep. 8, 2011 in corresponding Korean Patent Application No. 10-2010-7021228.

Korean Notice of Preliminary Rejection (Non-Final) dated May 31, 2012 in corresponding Korean Patent Application No. 10-2010-7021228.

Cerofolini et al., "Strategies for nanoelectronics", *Microelectronic Engineering*, vol. 81, pp. 405-419.

* cited by examiner

METHOD OF FORMING PITCH MULTIPLIED CONTACTS

PRIORITY CLAIM

This application is a continuation of U.S. patent application Ser. No. 11/215,982, filed Aug. 31, 2005.

REFERENCE TO RELATED APPLICATIONS

This application is related to the following: U.S. patent application Ser. No. 10/931,772 to Abatchev et al., filed Aug. 31, 2004, entitled Critical Dimension Control; U.S. patent application Ser. No. 11/010,752, to Haller, filed Dec. 13, 2004, and assigned to Micron, Inc.; U.S. patent application Ser. No. 10/922,583, filed Aug. 19, 2004, and assigned to Micron, Inc.; U.S. patent application Ser. No. 10/932,993 to Abatchev et al., filed Sep. 1, 2004, entitled Mask Material Conversion; U.S. patent application Ser. No. 10/934,778 to Abatchev et al., filed Sep. 2, 2004, entitled Method for Integrated Circuit Fabrication Using Pitch Multiplication; U.S. patent application Ser. No. 10/931,771 to Tran et al., filed Aug. 31, 2004, entitled Methods for Increasing Photo-Alignment Margins; U.S. patent application Ser. No. 10/934,317 to Sandhu et al., filed Sep. 2, 2004, entitled Method to Align Mask Patterns; U.S. patent application Ser. No. 10/934,621, filed Sep. 2, 2004, and assigned to Micron, Inc.; U.S. patent application Ser. No. 10/933,062, filed Sep. 1, 2004, and assigned to Micron, Inc.; U.S. patent application Ser. No. 11/150,408 to Wells, filed Jun. 9, 2005, entitled Method and Apparatus for Adjusting Feature Size and Position; U.S. patent application Ser. No. 11/144,543 to Sant et al., filed Jun. 2, 2005, entitled Multiple Spacer Steps for Pitch Multiplication; U.S. Provisional Patent Application No. 60/666,031 to Tran et al., filed Mar. 28, 2005, entitled Integrated Circuit Fabrication; U.S. patent application Ser. No. 11/216,477 to Tran et al., filed on even date herewith, entitled Integrated Circuit Fabrication; U.S. Patent Application No. 60/662,323 to Tran et al., filed Mar. 15, 2005, entitled Pitch Reduced Patterns Relative To Photolithography Features; U.S. patent application Ser. No. 11/134,982 to Abatchev et al., filed May 23, 2005, entitled Method for Patterning of the Array of Small Holes or Pillars; and U.S. patent application Ser. No. 10/783,843 to Busch et al., filed Feb. 20, 2004, entitled Capacitor Structures, DRAM Arrays, Methods of Forming Openings, and Methods of Forming Container Capacitors. Each of the above-mentioned references is hereby incorporated by reference in its entirety and made part of this specification.

BACKGROUND OF THE INVENTION

1. Field of the Invention

The disclosed invention relates generally to integrated circuit fabrication, techniques for fabrication of computer memory, and masking techniques.

2. Description of the Related Art

As a consequence of many factors, including demand for increased portability, computing power, memory capacity and energy efficiency in modern electronics, integrated circuits are continuously being reduced in size. To facilitate this size reduction, research continues into ways of reducing the sizes of integrated circuits' constituent features. Examples of those constituent features include capacitors, electrical contacts, interconnecting lines, and other electrical devices. The trend of decreasing feature size is evident, for example, in memory circuits or devices such as dynamic random access memories (DRAMs), static random access memories (SRAMs), ferroelectric (FE) memories, electronically-erasable programmable read-only memories (EEPROMs), flash memories, etc.

A NAND flash memory chip, for example, typically comprises millions of identical circuit elements, known as memory cells, arranged in a plurality of arrays with associated logic circuitry. Each memory cell traditionally stores one bit of information, although multi-level cell devices can store more than one bit per cell. In its most general form, a memory cell typically consists of two electrical devices: a storage capacitor and an access field effect transistor. Each memory cell is an addressable location that can store one bit (binary digit) of data. A bit can be written to a cell through the transistor and read by sensing charge on the storage electrode from the reference electrode side. By decreasing the sizes of constituent electrical devices, the conducting lines that connect them, and the conductive contacts carrying charge between them, the sizes of the memory devices incorporating these features can be decreased. Storage capacities and circuit speed can be increased by fitting more memory cells into the memory devices.

The continual reduction in feature sizes places ever greater demands on techniques used to form the features. For example, photolithography is commonly used to pattern features on a substrate. The concept of pitch can be used to describe the size of these features. Pitch is the distance between identical points in two neighboring features. These features are typically defined by spaces between adjacent features, which spaces may be filled by a material, such as an insulator. As a result, pitch can be viewed as the sum of the width of a feature and of the width of the space separating that feature from a neighboring feature, when that neighboring feature is part of a repeating or periodic pattern, such as may occur in an array of features, for example.

Certain photoresist materials only respond to certain wavelengths of light. One common range of wavelengths that can be used lies in the ultraviolet (UV) range. Because many photoresist materials respond selectively to particular wavelengths, photolithography techniques each have a minimum pitch below which that particular photolithographic technique cannot reliably form features. This minimum pitch is often determined by the wavelength of light that can be used with that technique. Thus, the minimum pitch of a photolithographic technique can limit feature size reduction.

Pitch multiplication (or pitch doubling or pitch reduction) can extend the capabilities of photolithographic techniques to allow creation of more densely arranged features. Such a method is illustrated in FIGS. 1A-1F and described in U.S. Pat. No. 5,328,810, issued to Lowrey et al., the entire disclosure of which is incorporated herein by reference and made part of this specification. For convenience, the method will also be briefly outlined here.

With reference to FIG. 1A, photolithography is first used to form a pattern of lines 10 in a photoresist layer overlying a layer 20 of an expendable material and a substrate 30. The layers shown in FIG. 1 are all shown schematically in cross-section. As shown in FIG. 1B, the pattern is then transferred by an etch step (preferably anisotropic) to the layer 20, forming placeholders, or mandrels, 40. If the etch is anisotropic, the mandrels have approximately vertical sides, as shown. The photoresist lines 10 can be stripped and the mandrels 40 can be isotropically etched to increase the distance between neighboring mandrels 40, as shown in FIG. 1C. This isotropic etch (or shrink step) can alternatively be performed on the resist prior to transfer. A layer 50 of spacer material is subsequently deposited over the mandrels 40, as shown in FIG. 1D. Spacers 60, i.e., material extending or originally formed extending from sidewalls of another material, are then formed on the sides of the mandrels 40 by preferentially etching the spacer material from the horizontal surfaces 70 and 80 in a directional (or anisotropic) spacer etch. Such spacers are shown in FIG. 1E. The remaining mandrels 40 are then removed, leaving behind only the spacers 60 above substrate 30. The spacers 60 together act as a mask for patterning, as shown in FIG. 1F. Thus, where a given pitch formerly included a pattern defining one feature and one space, the same width now includes two features and two spaces defined by the spacers 60. As a result, the smallest feature size possible with a photolithographic technique is effectively decreased by this "pitch-multiplication" technique.

While the pitch is actually halved in the example above, this reduction in pitch is conventionally referred to as pitch "doubling," or, more generally, pitch "multiplication." That is, conventionally "multiplication" of pitch by a certain factor actually involves reducing the pitch by that factor. In fact, "pitch multiplication" increases the density of features by reducing pitch. Pitch thus has at least two meanings: the linear spacing between identical features in a repeating pattern; and the density or number of features per linear distance. The conventional terminology is retained herein.

The critical dimension (CD) of a mask scheme or circuit design is the scheme's minimum feature dimension, or the measurement of the smallest width of the smallest feature that exists in that design or scheme. Due to factors such as geometric complexity and different requirements for critical dimensions in different parts of an integrated circuit, typically not all features of the integrated circuit will be pitch multiplied. Furthermore, pitch multiplication entails many additional steps relative to conventional lithography; the additional steps can involve considerable additional expense. However, if some features of an integrated circuit are pitch multiplied, it is inconvenient if connecting features that interface with those features are not also pitch multiplied. Thus, features that are configured to contact each other are advantageously of similar dimensions. Such similar dimensions can allow for smaller and more efficient operative units on an integrated circuit, thus increasing feature density and decreasing chip size.

Conventional methods of forming contacts through insulating materials to create electrical connections between underlying and overlying circuit layers have not allowed the density of contact features to match the density of the features intended to be connected by those contact features. Accordingly, there is a need for methods of forming contacts with reduced dimensions that can match the density of the features intended to be connected by those contact features, especially where pitch multiplication has been used to form the features to be connected.

Furthermore, there is a need for a reduction in the size of integrated circuits and an increased operable density of the arrays of electrical devices on computer chips. Accordingly, a need exists for improved methods of forming small features; improved methods for increasing feature density; methods that will produce more efficient arrays; and techniques that will provide more compact arrays without harming feature resolution.

SUMMARY OF THE INVENTION

In some embodiments, the invention comprises a method of forming electrical contacts. Such contacts can be formed by providing an insulating layer that is overlaid by multiple layers of masking material. A series of selectively definable lines can then be created in the masking material, where the lines have a pattern. Pitch reduction can then be performed on the lines using a spacer material to create pitch-reduced masking lines that are elongate along a spacer axis. Each pitch-reduced masking line can thus be separated by a pitch-reduced space. A second pattern of photoresist that crosses a portion of the masking features can then be applied. The second pattern can have a window that leaves multiple portions of the pitch-reduced masking lines and adjacent pitch-reduced spaces uncovered by the photoresist. The window can have an elongate axis that is not parallel to the elongate axis of the pitch-reduced masking lines. The insulating layer can then be etched through a third pattern—defined, in part, by the pitch-reduced spaces—to create contact vias in the insulating layer. The contact vias can be filled with a conductive material to create electrical contacts.

In some embodiments, the invention comprises a method of forming elongate vias for an integrated circuit. The method can include depositing at least one layer of masking material over an underlying layer. The method can also include forming a first set of lines in a layer of masking material using conventional photolithography. Pitch-reduced spacer lines can be created that are elongate along an axis parallel to the first set of lines, and the spacer lines can give rise to a first pattern. A second pattern can also be formed using conventional lithography in a layer overlying the pitch-reduced lines. The second pattern can have an opening, and the opening can have a first width along an axis that is parallel to the elongate axis of the pitch-reduced lines. Furthermore, the first width can be definable without using pitch reduction techniques. Then, the insulating layer can be etched through a combined pattern defined by a superposition of the two patterns to create contact vias in the underlying layer.

In some embodiments, the invention comprises a method of making an integrated circuit. The method can include layering materials to form an insulating layer, a temporary layer overlying the insulating layer, and a first selectively definable layer overlying the temporary layer. Features can be formed in those layers that correspond to a first pattern in the first selectively definable layer. The first pattern can be transferred to the temporary layer, and spacers can be formed on the sidewalls of the features in the temporary layer. The features of the temporary layer can be removed and leave behind the spacers that correspond to a second pattern. Moreover, a second selectively definable layer can be applied over the spacers, and features can be formed that correspond to a third pattern in the second selectively definable layer. Then, holes can be etched in an underlying layer exposed by spaces in the second and third patterns. After hole formation, conductive material can be inserted into the holes such that the conductive material forms circuit features, each feature having a length and a width, wherein the width is determined by a resolution of the second pattern, and the length is determined by a resolution of the third pattern.

In some embodiments, the invention can comprise a computer memory array that comprises: a series of transistors; a series of bitlines overlying the transistors; and a series of contacts between the transistors and bitlines. The contacts can have reduced pitch in one dimension and have another dimension definable by conventional photolithography.

In some embodiments, the invention can comprise an integrated circuit comprising: multiple transistors having a pitch width; multiple overlying digit lines having a pitch width; and multiple electrical contacts extending vertically between the transistors and digit lines. the contacts can have a pitch width that approximates the pitch widths of the transistors and digit lines.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF THE PREFERRED EMBODIMENT

Figure 1A:
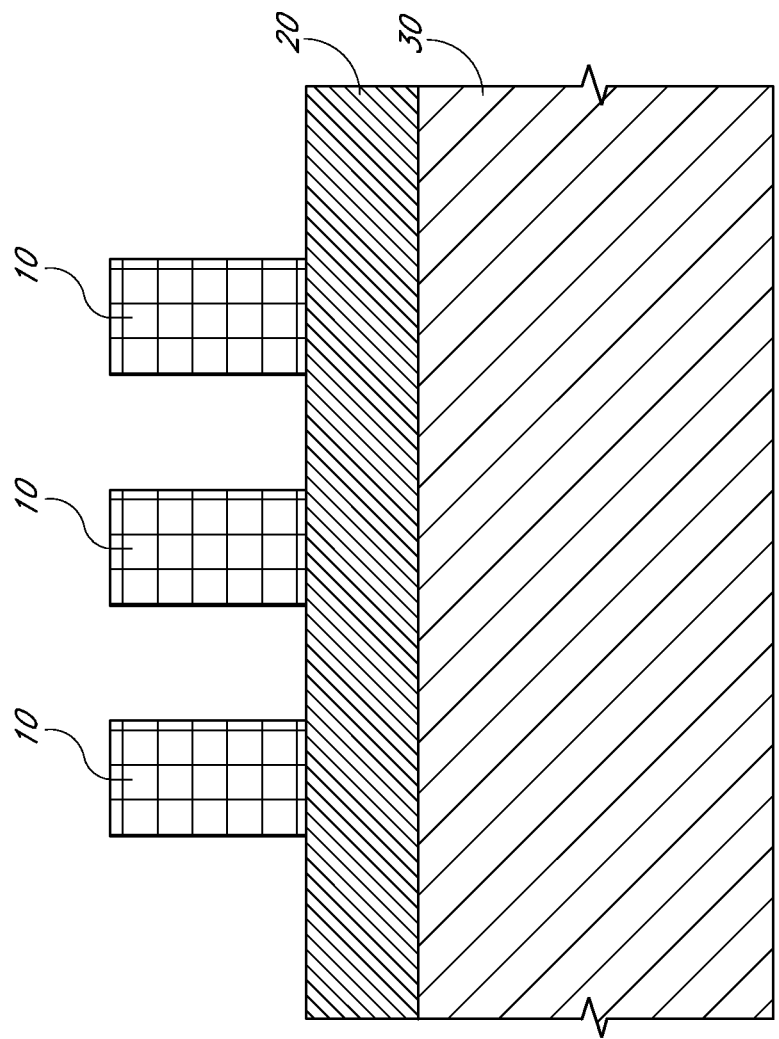
FIGS. 1A-1F are schematic, cross-sectional side views of mask lines, formed in accordance with a prior art pitch-multiplication method as described above.
Figure 1B:
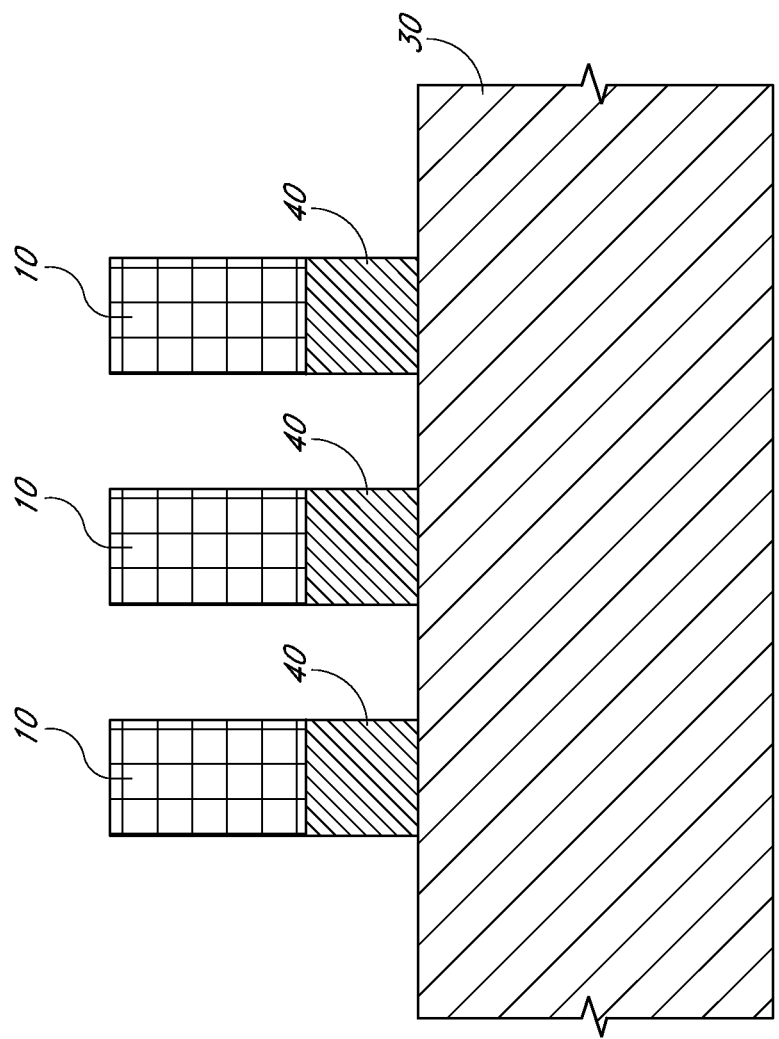
Figure 1C:
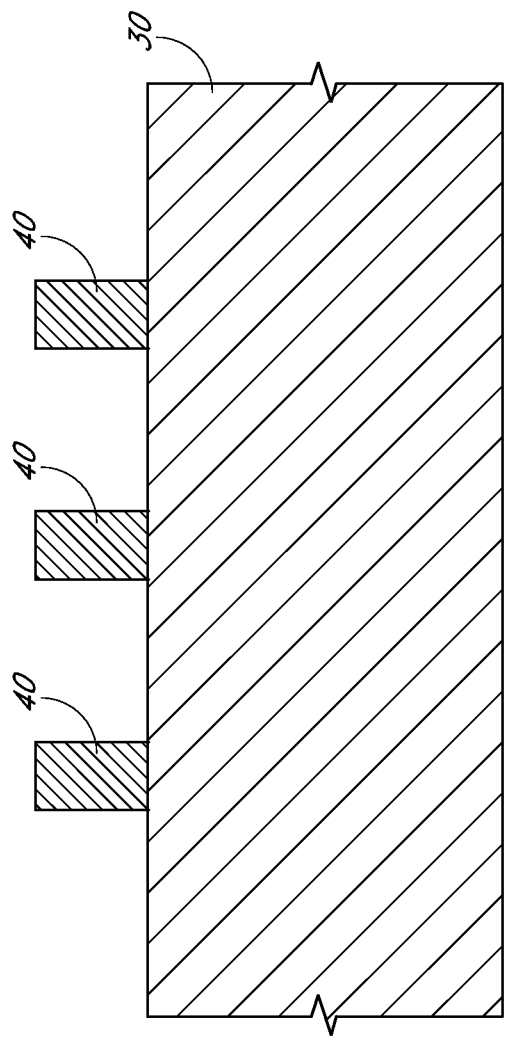
Figure 1D:
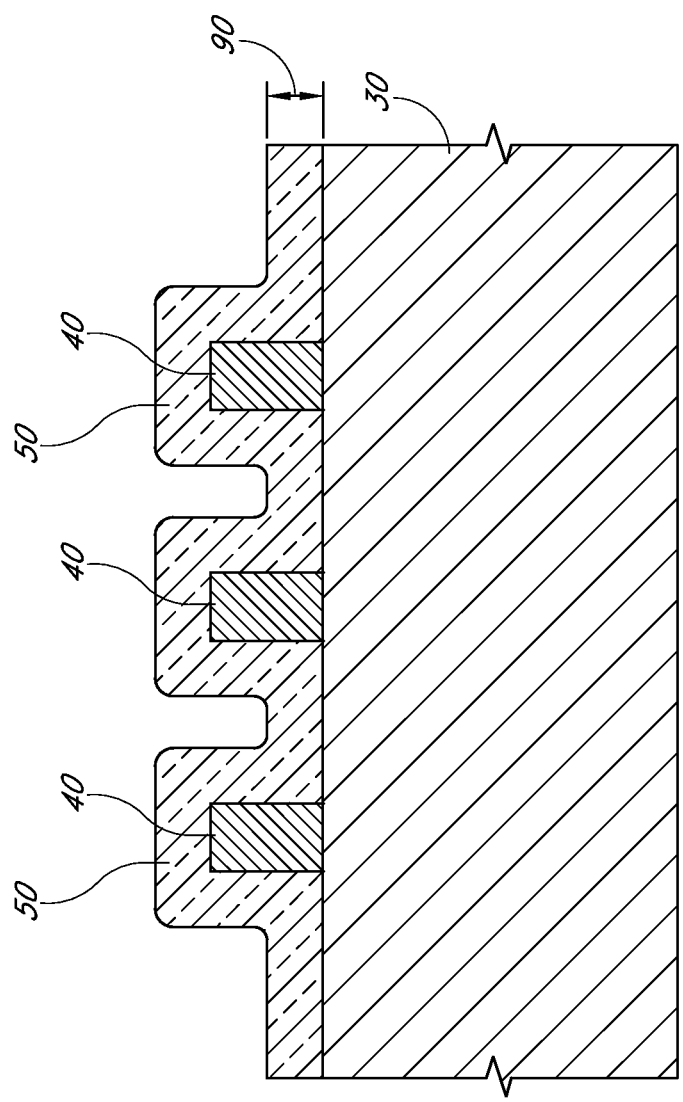
Figure 1E:
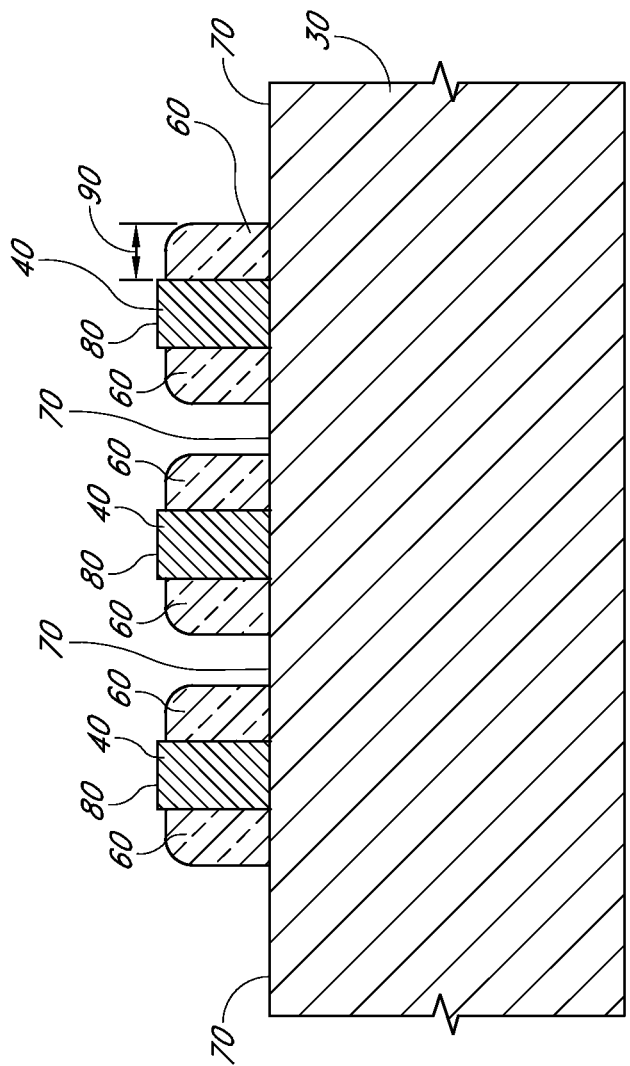
Figure 1F:
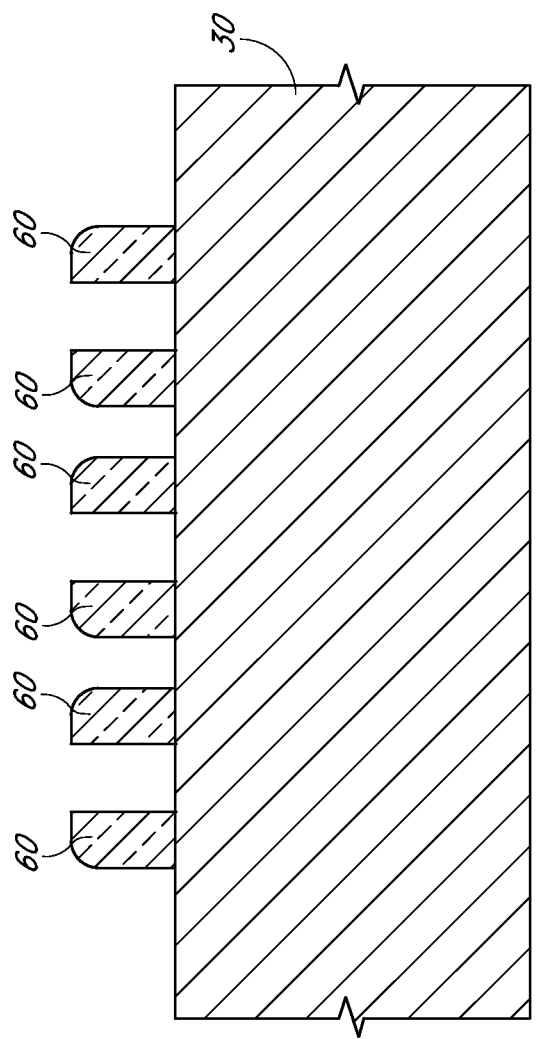
Figure 2:
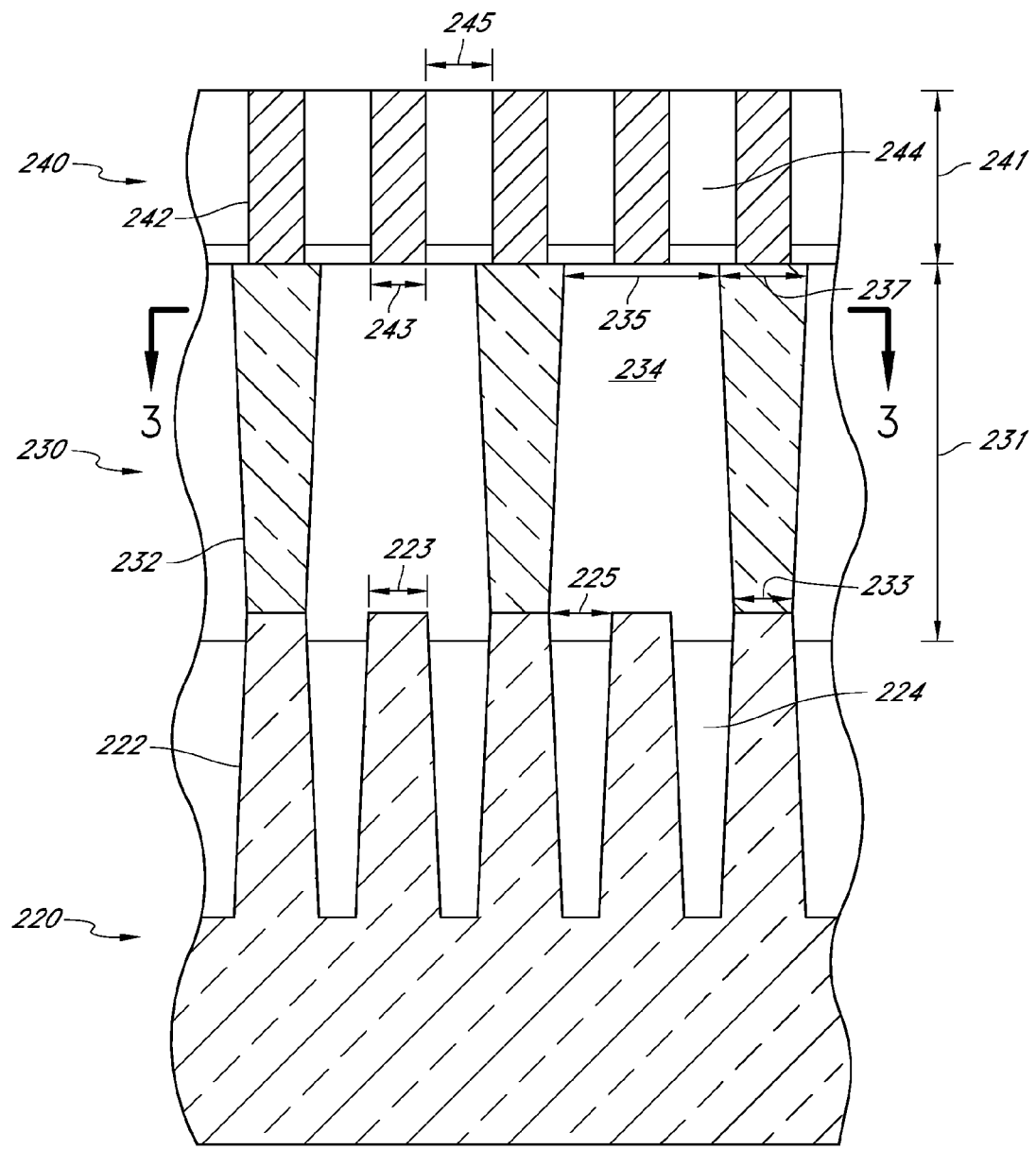
FIG. 2 is a schematic, cross-sectional side view of a portion of an integrated circuit using staggered contacts to interface with a pitch-multiplied array of transistors.

With reference to FIG. 2, a portion of an integrated circuit is shown in cross-section. In an underlying substrate level 220, the features 222 are formed to extend upwardly. In some embodiments, the features 222 taper so that the features 222 have a thinner cross section at their upper extremity than they do at their bottom extremity. This tapered shape can be a result of an etching step with a lateral etch component due to the upper portions of the features being exposed to an etching chemistry for a longer period of time than the lower portions. The features 222 are advantageously longer in a dimension into and out of the plane of the paper, so that the critical dimension of the features 222 is different in the X and Y dimensions. Transistor pillars (not shown) preferably protrude above the ridges defined by the features at other locations. U.S. patent application Ser. No. 11/010,752, to Haller, filed Dec. 13, 2004, and assigned to Micron, Inc., U.S. patent application Ser. No. 10/934,621, filed Sep. 2, 2004, and assigned to Micron, Inc., and U.S. patent application Ser. No. 10/933,062, filed Sep. 1, 2004, and assigned to Micron, Inc., which are hereby incorporated by reference and made part of the specification hereof, provide exemplary methods for configuring transistor pillars in an integrated circuit. Furthermore, preferred methods for forming features such as the features 222 are described, for example, in U.S. patent application Ser. No. 10/922,583, filed Aug. 19, 2004, and assigned to Micron, Inc., the disclosure of which is hereby incorporated by reference and made part of this specification. Advantageously, the features 222 can be formed using a pitch-multiplication process that uses hard mask spacers to increase feature density and reduce the critical dimension, as disclosed, for example, in the '752, '621, and '062 applications.

In some embodiments, the features 222 can have different configurations. For example, the features may have corners that are less sharply-defined than those of the illustrated features 222. Furthermore, the proportions, shape, spacing, height, width, and contours of the features 222 may vary from the illustration in FIG. 2. The features 222 can comprise portions of one or multiple transistors, diodes, capacitors, conductive lines, NOR logic arrays, NAND logic arrays, gates, sources, drains, contacts to any of the above, etc. In some embodiments, the features 222 are formed from a substrate material that comprises a semi-conducting material. For example, the semi-conducting material can be silicon, silicon-germanium compounds, or III-V materials. In the illustrated embodiment, the features 222 are formed from silicon and define transistor active areas for a memory array.

Furthermore, the features 222 preferably have a width 223 at their upper extremity of less than 120 nanometers (nm). More preferably, width 223 can be less than 70 nm. More preferably, the width 223 can be approximately 60 nm. In the future, the width 223 can be approximately 50 nm or less than 50 nm.

The features 222 are separated by trenches 224 that are preferably filled with an insulating material. The trenches 224 can be formed using shallow trench formation techniques. Preferred methods for forming trenches 224 are described in the '752, '621, and '062 applications, incorporated herein above. Additional more shallow trenches, perpendicular to the illustrated trenches 224, can provide separation between different transistors along the active area ridges or features 222.

In a preferred embodiment, trenches 224 are filled with a form of silicon oxide. Furthermore, trenches 224 preferably have a width 225 at their upper extremity of less than 120 nm. More preferably, width 225 is less than 70 nm, and is defined by pitch multiplication. Even more preferably, width 225 can be approximately 50 nm or less than 50 nm. Typically, trench width 225 will be greater than feature width 223 because of the effect of etching processes on the features 222, as discussed above. Preferably, width 225 is designed jointly with the material that fills trench 224 to deter electrical interaction between the features 222.

As used in this specification, the term "pattern" can refer to an array or series of shapes that would be visible on a surface if viewed from above. A pattern can refer to the ensemble of shapes that correspond to a cross-section or shadow of features formed in one or multiple layers. The pattern is generally not the features themselves, but rather the design corresponding to the sizes and arrangement of the features. A pattern can be defined by a combination of patterns derived from multiple overlying or side by side layers. A pattern can originate in one layer, such as a photodefinable layer, and then be transferred to another layer, such as a temporary layer or a hard mask layer. The pattern is said to be transferred to lower layers even if feature sizes and spacings are altered (e.g., by the feature shrink step noted above). In contrast, a new pattern is defined by pitch multiplication, whereby two features in the second pattern replace one feature of the first pattern.

A pattern in one layer can be derived from one or more patterns in another previous or overlying layer. A pattern can be said to be derived from another pattern even if the features in the resulting layer do not exactly resemble those features which gave rise to the original pattern.

An arrangement of features formed in a particular layer can give rise to a pattern. An array can also give rise to a pattern. An array is a collection of electrical components or features, formed in a repeating pattern, that can span multiple layers of an integrated circuit. As described above, multiple cells can form a memory array for a NAND flash memory circuit, for example, or a logic array.

With further reference to FIG. 2, an overlying level 240 overlies the levels 230 (discussed below) and 220. Advantageously, the level 240 can have a thickness 241 of less than 0.65 µm. The level 240 can have a thickness 241 of between 50 nm and 200 nm. In some embodiments, the level 240 has a thickness 241 of approximately 150 nm.

The overlying level 240 includes conductive lines 242. In some embodiments, the lines 242 have a rectangular cross section, as shown. The lines 242 are advantageously longer in a dimension that extends into and out of the plane of the page, so that the critical dimension of the lines 242 can be determined from the cross section shown. Advantageously, the lines 242 can be formed using a pitch-multiplication process that uses hard mask spacers to increase line density and reduce the critical dimension. In some embodiments, the lines 242 can have different configurations. For example, the lines 242 may have corners that are less sharply-defined than those of the illustrated lines 242. Furthermore, the proportions, shape, spacing, height, width, and contours of the lines 242 may vary from the illustration in FIG. 2. In some embodiments, the lines 242 are formed from metal. For example, the conductive material can be copper, aluminum, a conductive alloy of copper or aluminum, etc. In a preferred embodiment, the lines 242 are digit lines or bit lines for a memory array. In a preferred embodiment, the lines 242 are part of a NAND flash memory or DRAM array.

Furthermore, the lines 242 preferably have a width 243 of less than 120 nm and are defined by pitch multiplication. More preferably, width 243 can be less than 70 nm. Even more preferably, width 243 can be approximately 50 nm or less than 50 nm.

The lines 242 are separated by gaps 244 that are preferably filled with an insulating material, which can be a low-k dielectric, for example. For example, gaps 244 can be filled with a dielectric material. In conventional metallization, the lines 242 are formed first and gaps 244 are filled in a subsequent step, whereas in damascene metallization the gaps 244 are first defined between trenches in an insulator, and the trenches are filled to define the lines 242. In either case, the pattern in level 240 can be formed using pitch multiplication. Thus, the gaps 244 preferably have a width 245 of less than 120 nm. More preferably, width 245 can be less than 70 nm. Even more preferably, width 245 can be approximately 50 nm. Preferably, width 245 is designed jointly with the material that defines or fills gaps 244 to deter electrical interaction between lines 244.

With further reference to FIG. 2, an intermediate level 230 is located between the underlying substrate level 220 and the overlying level 240. Advantageously, intermediate level 230 can have a thickness 231 of less than 1 µm. In preferred embodiments, level 230 has a thickness 231 in a range of approximately 0.50 µm to approximately 0.65 µm.

The intermediate level 230 comprises contacts 232 and insulating material 234. The insulator 234 is sometimes referred to as an "inter-level dielectric" or ILD. ILDs are commonly used to separate underlying features (such as source areas for transistors, or the features 222) from overlying conductive elements (such as bit lines, or the lines 242). Contacts are formed that extend through the ILD, connecting specific underlying features with specific overlying conductive elements. The term "inter-level dielectric" can imply that an ILD is not, in itself, a level but only lies between two conductive levels. However, for convenience, this disclosure will refer to intermediate level 230 as a "level."

In some embodiments, contacts 232 taper so that the contacts 232 have a thinner cross section at their lower extremity than they do at their upper extremity. This tapered shape can result from a dry etch process wherein the upper portion of the ILD 234 is exposed to an etchant for a longer period of time than the lower portion, advantageously providing a wider landing area for the overlying lines 242 while maintaining a narrower width at the lower end to avoid touching unrelated structures due to misalignment.

Figure 3:
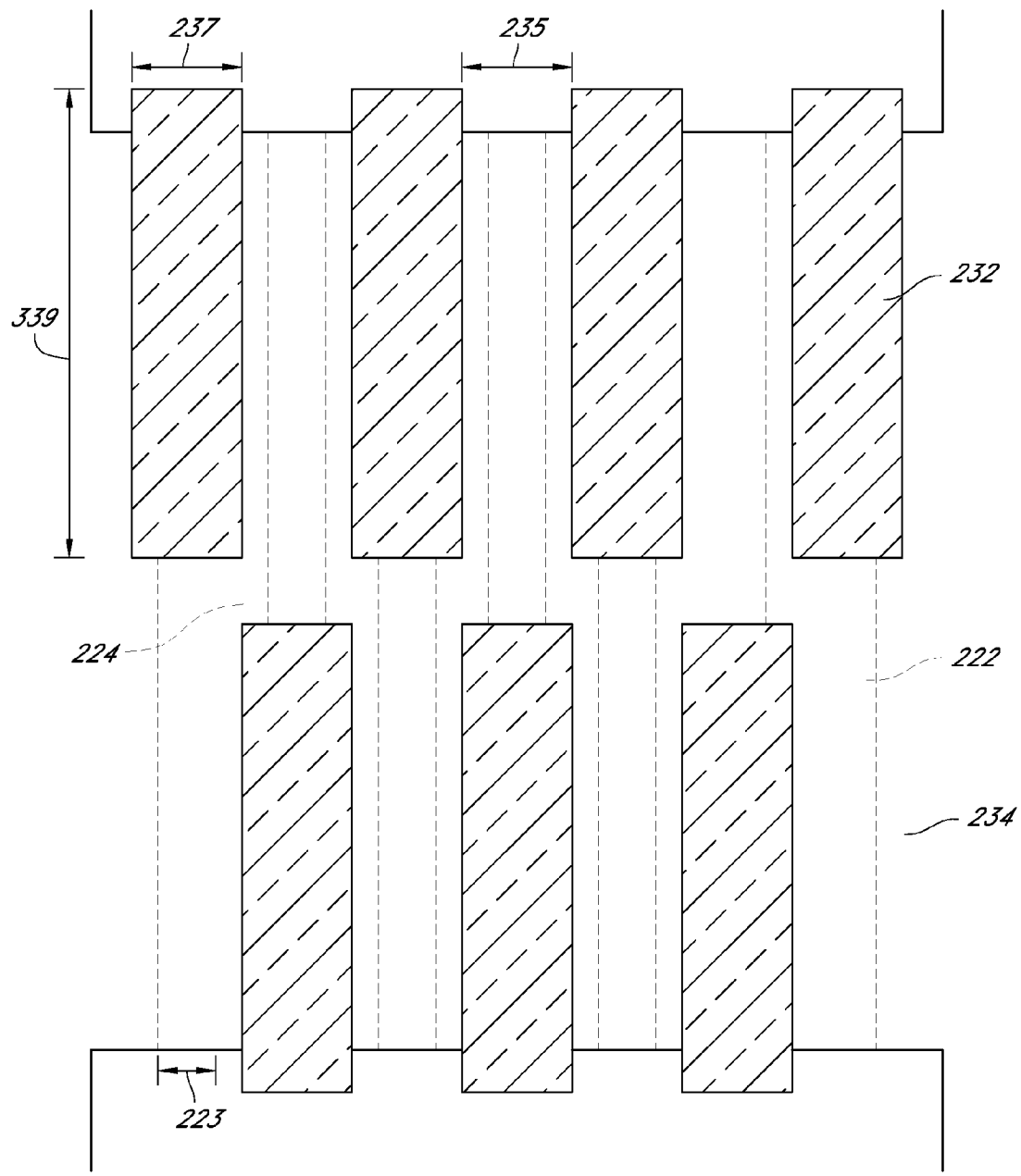
FIG. 3 is a schematic, cross-sectional plan view of a section taken along lines 3-3 of the integrated circuit of FIG. 2 showing the layout of the staggered contacts.

In FIG. 2, contacts 232 have been defined using conventional photolithography. The contacts 232 have been staggered (see FIG. 3), because the contacts 232 do not have the same pitch width as the features 222. Thus, contacts formed from conventional photolithography can be used to contact pitch-multiplied features. This can be accomplished because of the taper effect that can result from etch steps as described above, and because conventional photolithography allows one mask to define two dimensions of features. These effects, combined with staggered geometry—offsetting two different sets or groups of features with respect to each other—allow the contacts 232 to provide appropriate contact without shorting. (FIG. 3 illustrates the staggered geometry). In the cross section of FIG. 2, all five features 222 do not abut a corresponding contact 232. In fact, because the contacts 232 are spaced so widely apart, the contacts 232 only contact three of the five illustrated features 222. The remaining two features 222 are contacted by contacts 232 that would be visible if the cross-section were taken in a different plane, as illustrated by FIG. 3.

The contacts 232 can have different configurations. For example, the features may have corners that are less sharply-defined than those of the illustrated contacts 232. Furthermore, the proportions, shape, spacing, height, width, and contours of contacts 232 may vary from the illustration in FIG. 2. The contacts 232 can be formed e.g., from polysilicon, metal, or a combination of polysilicon and metal or metal silicide.

Furthermore, the contacts 232 have a width 233 at their lower extremity of less than 120 nm. Preferably, the width 233 corresponds to width 223 of the features 222 (i.e., about 50 nm). Thus, as illustrated, when contacts 232 and the features 222 are aligned, their widths are the same where they contact each other, despite the fact that the features 222 are pitch multiplied and the contacts 232 are defined by conventional lithography.

The contacts 232 each have a width 237 at their upper extremity of approximately 70 nm. The width 237 is thus not so large as to contact more than one of the lines 242. However, the contacts 232 are wider than the lines 242, so that even when perfectly aligned, contacts 232 extend beyond the lines 242 by approximately 10 nm on either side near the interface between levels 230 and 240. When the contacts 232 are wider than lines such as the lines 242 as shown here, it is difficult to arrange contacts to interface with each line 242 and feature 222. If two more contacts 232 were added to the illustrated configuration, for example, thus establishing electrical contact between the remaining two lines 242 and features 222, those contacts would risk overlapping the wider portions of the existing contacts 232. Thus, a series of contacts 232 that is not pitch multiplied can only contact every other pitch multiplied underlying feature, as illustrated.

One approach that can allow each line 242 to contact a corresponding feature 222 using contacts 232 is to stagger the contacts 232. FIG. 3 illustrates such a staggered-contact configuration. FIG. 3 illustrates a cross-section of the contacts 232, taken along a plane near the top of level 230, as shown in FIG. 2. The features 222 are shown with dashed lines to indicate they are hidden beneath insulating material 234. Also hidden underneath insulating material 234 are the trenches 224, which alternate with the features 222. In the illustrated arrangement, the contacts 232 have a width 237 in their critical dimension that is shorter than their length 339 in a non-critical dimension. Alternatively, contacts formed conventional photolithography could also be round and still function properly if they were properly staggered and aligned. FIG. 3 shows how contacts 232 are staggered in order to contact adjacent underlying features 222. This is because the upper contact width 237 is wider than the underlying feature width 223, as shown.

One disadvantage of using staggered contacts formed through conventional photolithography techniques is the large amount of space required for such a configuration in an integrated circuit. As FIG. 3 shows, staggering the contacts 232 reduces contact density compared to the features and lines the contacts are designed to connect. Thus, in FIG. 3, the space required for the contacts 232 to contact the underlying features 222 is larger than it would be if the contacts 232 did not have to be staggered. In particular, whereas the region of an integrated circuit devoted to the contacts 232 could have a dimension of approximately the length 339 of the contacts 232, contact staggering requires that that dimension be approximately twice the length 339 of a single contact 232. Because an integrated circuit typically has multiple regions with multiple contacts, staggered contacts can have a large cumulative effect in reducing the feature density or increasing the die area of an integrated circuit.

Figure 4:
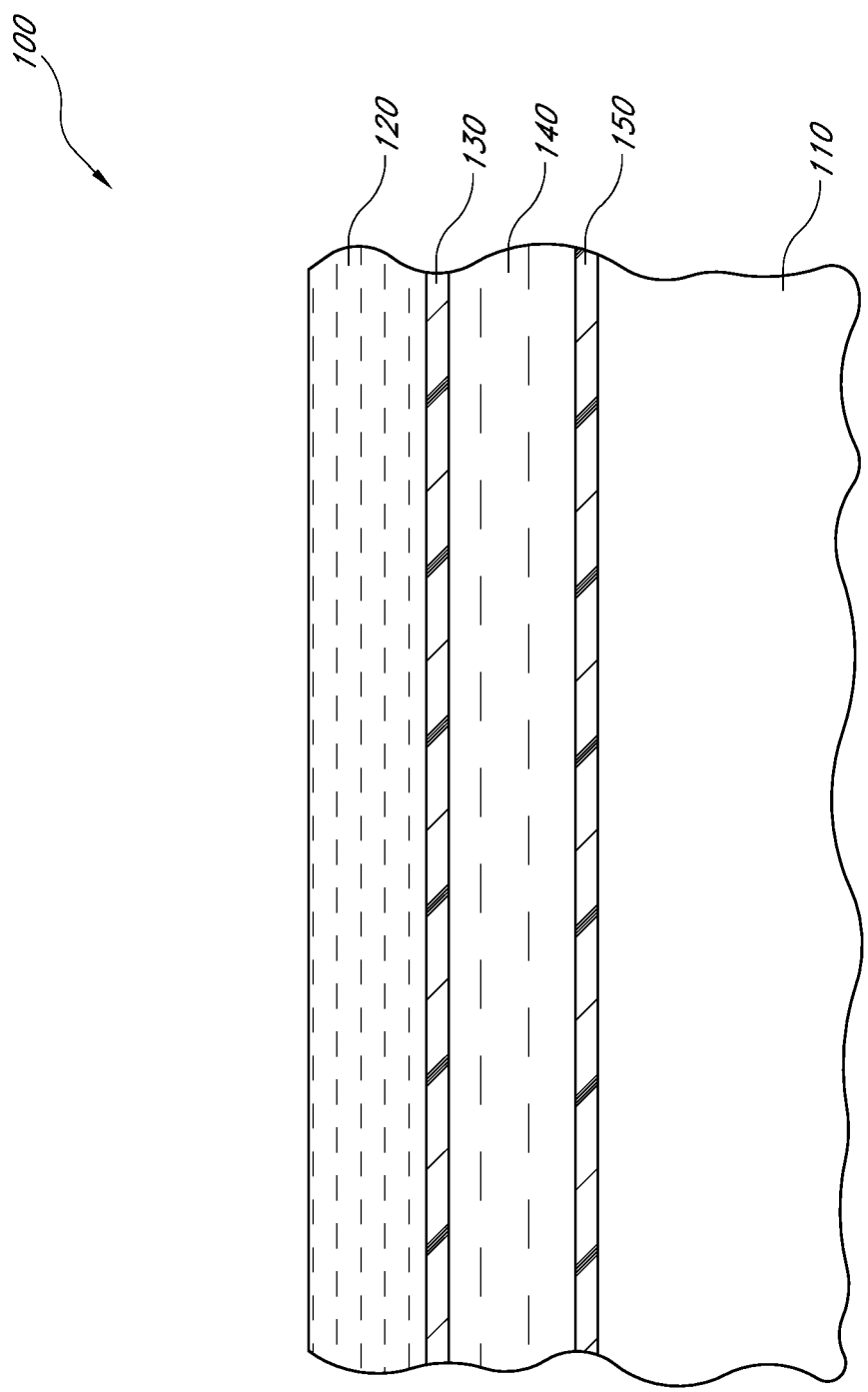
FIG. 4 is a schematic, cross-sectional side view of masking and substrate layers used to form an integrated circuit.

With reference to FIG. 4, a partially formed integrated circuit 100 is provided. A substrate 110 is provided below various masking layers 120-150. The layers 120-150 will be etched to form a mask for patterning the substrate 110 to form various features, as discussed below.

The materials for the layers 120-150 overlying the substrate 110 are preferably chosen based upon consideration of the chemistry and process conditions for the various pattern forming and pattern transferring steps discussed herein. Because the layers between a topmost selectively definable layer 120—which preferably is definable by a lithographic process—and the substrate 110 will preferably function to transfer a pattern derived from the selectively definable layer 120 to the substrate 110, the layers between the selectively definable layer 120 and the substrate 110 are preferably chosen so that they can be selectively etched relative to other exposed materials. A material is considered selectively, or preferentially, etched when the etch rate for that material is at least about 5 times greater, preferably about 10 times greater and, most preferably, at least about 40 times greater than that for surrounding (e.g., underlying or overlying) materials.

In the illustrated embodiment, the selectively definable layer 120 overlies a first hard mask, or etch stop, layer 130, which overlies a temporary layer 140, which overlies a second hard mask, or etch stop, layer 150, which overlies the substrate 110 to be processed (e.g., etched) through a mask. Optionally, the mask through which the substrate 110 is processed is formed in the second hard mask layer 150. For the illustrated embodiments, the substrate 110 includes an upper interlevel dielectric (ILD) layer through which contacts are to be formed, and may also include an upper etch stop or chemical-mechanical polishing (CMP) stop layers. In the illustrated embodiments, however, the hard mask 150 can serve as the CMP stop during etch back of the conductive filler.

In common methods of transferring patterns, both the mask and the underlying substrate are exposed to an etchant, which preferentially etches away the substrate material. The etchants, however, also wear away the mask materials, albeit at a slower rate. Thus, over the course of transferring a pattern, the mask can be worn away by the etchant before the pattern transfer is complete. These difficulties are exacerbated where the substrate 110 comprises multiple different materials to be etched. In such cases, additional mask layers (not shown) or more selective materials may be used to prevent the mask pattern from being worn away before the pattern transfer is complete.

Because the various layers are chosen based upon the requirements of chemistry and process conditions, one or more of the layers can be omitted in some embodiments. For example additional mask layers (not shown) can be omitted in embodiments where the substrate 110 is relatively simple, e.g., where the substrate 110 is a single layer of material and where the depth of the etch is moderate. In such cases, the second hard mask layer 150 may be a sufficient mask for transferring a pattern to the substrate 110. In the illustrated embodiments, mask layer 150 advantageously plays a protective role, protecting underlying layers from unwanted degradation during etch of overlying layers. Similarly, for a particularly simple substrate 110, the various other layers, such as the second hard mask layer 150 itself, may be omitted and overlying mask layers may be sufficient for the desired pattern transfer. Higher numbers of mask layers facilitate transferring patterns to difficult-to-etch substrates, such as a substrate comprising multiple materials or multiple layers of materials, or for forming small and high aspect ratio features.

With reference to FIG. 4, the selectively definable layer 120 is preferably formed of a photoresist, including any photoresist known in the art. For example, the photoresist can be any photoresist compatible with 13.7 nanometer (nm), 157 nm, 193 nm, 248 nm or 365 nm wavelength systems, 193 nm wavelength immersion systems or electron beam lithographic systems. Examples of preferred photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems. In other embodiments, the layer 120 and any subsequent resist layers can be formed of a resist that can be patterned by nano-imprint lithography, e.g., by using a mold or mechanical force to pattern the resist.

Photoresist is typically patterned by being exposed to radiation through a reticle and then developed. In the case of negative photoresist, radiation, e.g., light, is focused on parts of the photoresist that are to be retained, e.g., on the areas where the lines—such as lines 124 (see FIG. 5)—are to be formed. Typically, the radiation activates a photosensitive compound, e.g., a photo-induced acid generator (PAG), which decreases the solubility of the photoresist, e.g., by causing it to polymerize. Preferred embodiments may be applied using any definable material, including positive or negative photoresist.

The material for the first hard mask layer 130 preferably comprises an inorganic material, and exemplary materials include silicon oxide ($SiO_2$), silicon or a dielectric anti-reflective coating (DARC), such as a silicon-rich silicon oxynitride. In the illustrated embodiment, the first hard mask layer 130 is a dielectric anti-reflective coating (DARC). Thus, hard mask layer 130 can serve both as an intermediate hard mask and to reduce reflections during lithography. The temporary layer 140 is preferably formed of amorphous carbon, which offers very high etch selectivity relative to the preferred hard mask materials. More preferably, the amorphous carbon is a form of transparent carbon that is highly transparent to light and which offers further improvements for photo alignment by being transparent to wavelengths of light used for such alignment. Deposition techniques for forming a highly transparent carbon can be found in A. Helmbold, D. Meissner, Thin Solid Films, 283 (1996) 196-203, the entire disclosure of which is incorporated herein by reference and made part of this specification.

Using DARC material for the first hard mask layer 130 can be particularly advantageous for forming patterns having pitches near the resolution limits of a photolithographic technique. The DARC can enhance resolution by minimizing light reflections, thus increasing the precision with which photolithography can define the edges of a pattern. Optionally, an organic bottom anti-reflective coating (BARC) (not shown) can similarly be used in addition to or in place of the first hard mask layer 130 to control light reflections. An optional spin-on anti-reflective coating can be added between the first hard mask layer 130 and the layer 120.

The second hard mask layer 150 preferably comprises a dielectric anti-reflective coating (DARC) (e.g., a silicon oxynitride), silicon or aluminum oxide ($Al_2O_3$). In addition, like the temporary layer 140, additional mask layers (not shown) are preferably formed of amorphous carbon due to its excellent etch selectivity relative to many materials.

In addition to selecting appropriate materials for the various layers, the thicknesses of the layers 120-150 are preferably chosen depending upon compatibility with the etch chemistries and process conditions described herein. For example, when transferring a pattern from an overlying layer to an underlying layer by selectively etching the underlying layer, materials from both layers are removed to some degree. Thus, the upper layer is preferably thick enough so that it is not worn away over the course of the pattern transfer. The hard mask layers are advantageously thin so that their transfer or removal can be short, exposing surrounding materials to less wear.

In the illustrated embodiment, the selectively definable layer 120 is a photodefinable layer preferably between about 50-300 nm thick and, more preferably, between about 200-250 nm thick. The first hard mask layer 130 is preferably between about 10-50 nm thick and, more preferably, between about 15-30 nm thick. The temporary layer 140 is preferably between about 100-200 nm thick and, more preferably, between about 100-150 nm thick. The second hard mask layer 150 is preferably between about 20-80 nm thick and, more preferably, about 50 nm thick, depending on the selectivity with respect to the underlying layer.

The various layers discussed herein can be formed by various methods known to those of skill in the art. For example, various vapor deposition processes, such as chemical vapor deposition, can be used to form hard mask layers. Preferably, a low temperature chemical vapor deposition process is used to deposit the hard mask layers or any other materials, e.g., spacer material, over a mask layer, where the mask layer is formed of amorphous silicon. Such low temperature deposition processes advantageously prevent chemical or physical disruption of the amorphous carbon layer. Spin-on-coating processes can be used to form photodefinable layers. In addition, amorphous carbon layers can be formed by chemical vapor deposition using a hydrocarbon compound, or mixtures of such compounds, as carbon precursors. Exemplary precursors include propylene, propyne, propane, butane, butylene, butadiene and acetylene. A suitable method for forming amorphous carbon layers is described in U.S. Pat. No. 6,573,030 B1, issued to Fairbairn et al. on Jun. 3, 2003, the entire disclosure of which is incorporated herein by reference and made part of this specification. In addition, the amorphous carbon may be doped. A suitable method for forming doped amorphous carbon is described in U.S. patent application Ser. No. 10/652,174 to Yin et al., the entire disclosure of which is incorporated herein by reference and made part of this specification.

As noted above, in the illustrated embodiment, an insulating layer is formed, overlaid by multiple layers of masking material. The substrate 110 includes the insulating layer, and the masking layers 120-150 are formed thereover. In some embodiments, layer 150 can be a primary mask layer, layer 140 can be a temporary layer, and layer 120 can be a photoresist layer. In the illustrated embodiment, layer 150 is an etch stop layer or CMP stop layer.

In a first phase of methods in accordance with the preferred embodiments and with reference to FIGS. 4-11, a pattern of spacers is formed by pitch multiplication.

Figure 5:
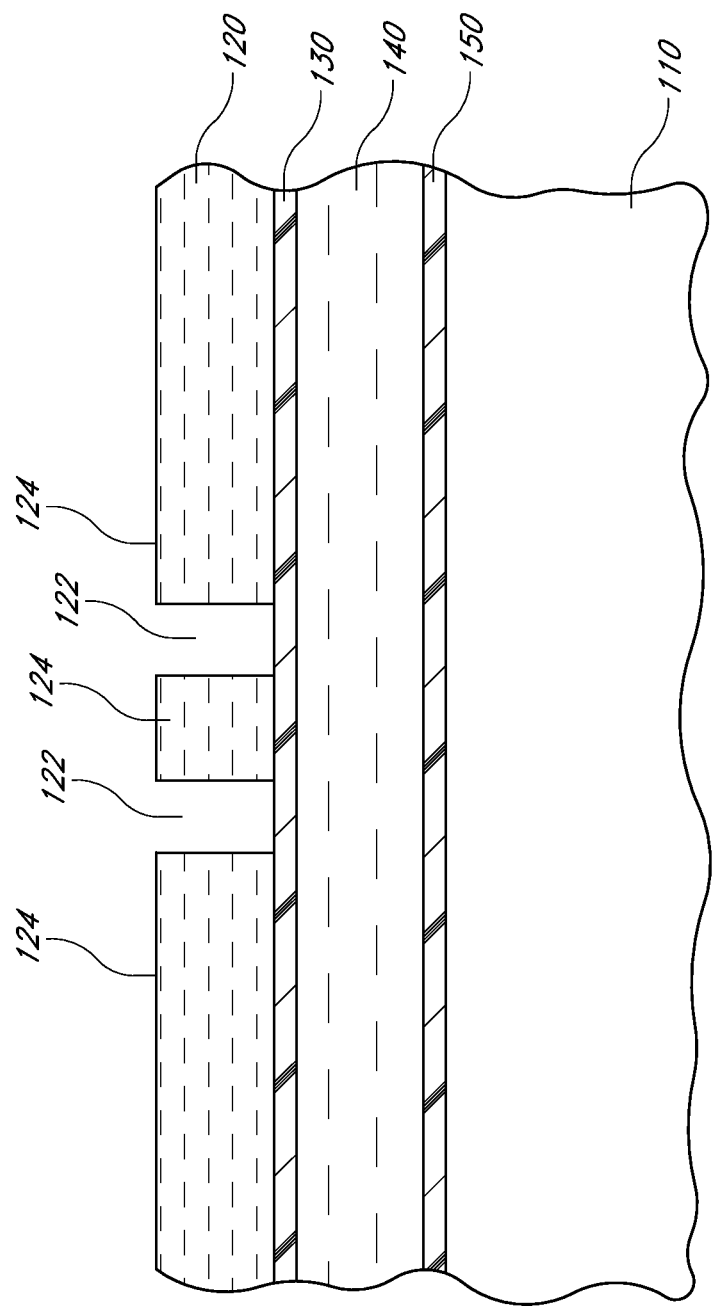
FIG. 5 shows the structure of FIG. 4 after photolithographic patterning of an overlying resist layer.

With reference to FIG. 5, a pattern comprising spaces 122 delimited by definable material features 124 is formed in the definable layer 120. The spaces 122 can be formed by, e.g., photolithography, in which the selectively definable layer 120 is exposed to radiation through a reticle and then developed. After being developed, the remaining definable material, photoresist in the illustrated embodiment, forms mask features such as the illustrated lines 124 (shown in cross-section).

The pitch of the resulting lines 124 is equal to the sum of the width of a line 124 and the width of a neighboring space 122. To minimize the critical dimensions of features formed using this pattern of lines 124 and spaces 122, the pitch is preferably at or near the limits of the photolithographic technique used to pattern the definable layer 120. For example, for photolithography utilizing 248 nm light, the pitch of the lines 124 can be about 100 nm. Thus, the pitch may be at the minimum pitch of the photolithographic technique and the spacer pattern discussed below can advantageously have a pitch below the minimum pitch of the photolithographic technique.

As illustrated by FIG. 5, a preliminary step can comprise creating a series of photoresist lines. Thus, photolithography can be used to form a plurality of lines in a mask material. Conventional photolithography can form lines having a pitch no smaller than that definable by photons. However, subsequent pitch multiplication will form lines having a pitch that is smaller than that definable by conventional photolithography.

Figure 6:
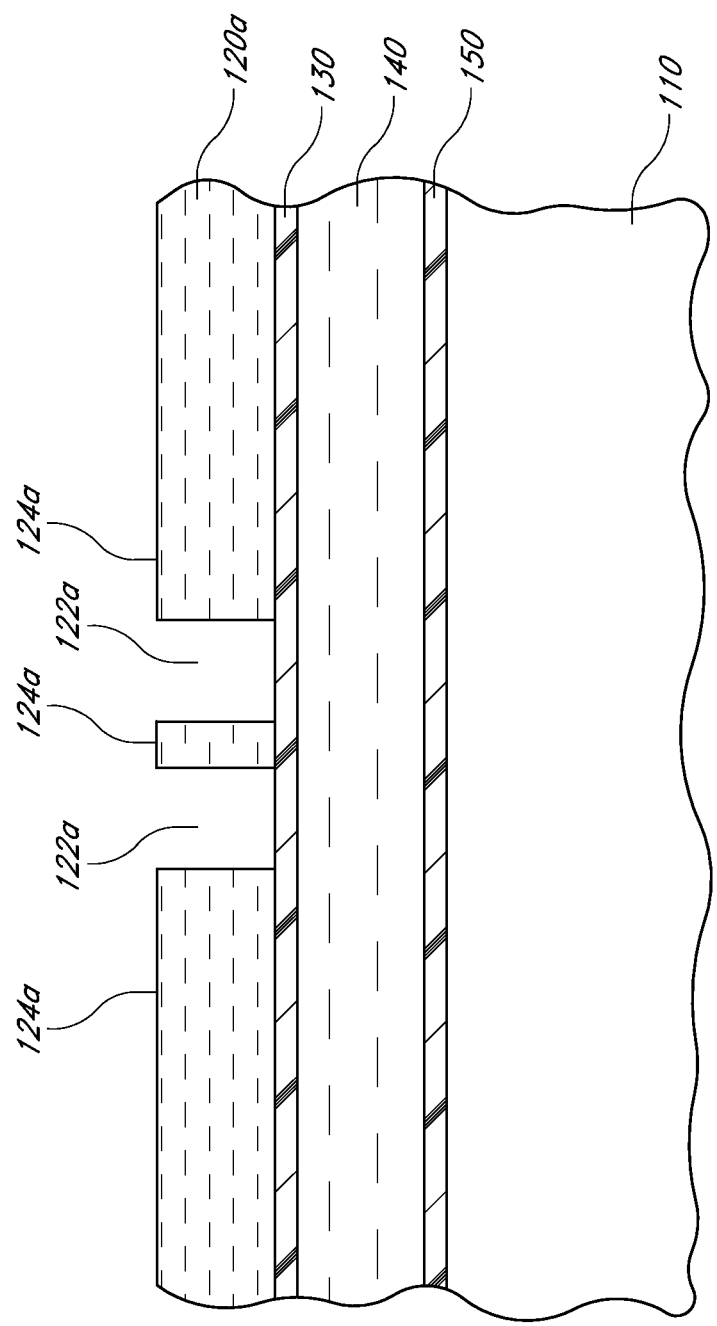
FIG. 6 shows the structure of FIG. 5 after a controlled isotropic resist shrink step.

As shown in FIG. 6, the spaces 122 can optionally be first widened or narrowed to a desired dimension. For example, the spaces 122 can be widened by etching the photoresist lines 124, to form modified spaces 122a and lines 124a. The photoresist lines 124 are preferably etched using an isotropic etch, such as a sulfur oxide plasma, e.g., a plasma comprising $SO_2$, $O_2$, $N_2$ and Ar. If an "isotropic" etch is used, the etch degrades the exposed surfaces from all directions. Thus, the corners of lines 124a may in practice be less sharp and well-defined than has been schematically depicted in FIG. 6. The extent of the etch is preferably selected so that the widths of the lines 124a are substantially equal to the desired spacing between the later-formed spacers 175, as will be appreciated from the discussion of FIGS. 9-11 below. Advantageously, this etch allows the lines 124a to be narrower than would otherwise be possible using the photolithographic technique used to pattern the photodefinable layer 120. In addition, the etch can smooth the edges of the lines 124a, thus improving the uniformity of those lines. In some embodiments, the spaces between the lines 124a can be narrowed by expanding the lines 124 to a desired size. For example, additional material can be deposited over the lines 124 or the lines 124 can be chemically reacted to form a material having a larger volume to increase their size.

Figure 9:
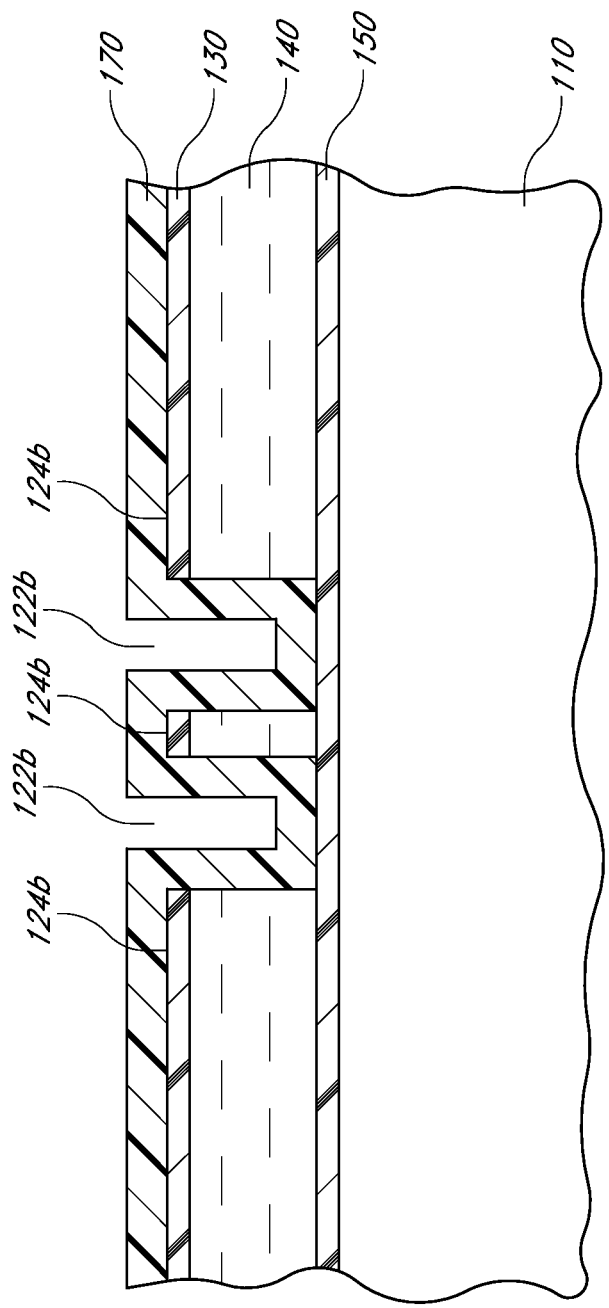
FIG. 9 shows the structure of FIG. 8 after blanket deposition of a spacer material.

The pattern in the (modified) photodefinable layer 120a is preferably transferred to the temporary layer 140 to allow for deposition of a layer 170 of spacer material (FIG. 9). The temporary layer 140 is preferably formed of a material that can withstand the process conditions for spacer material deposition and etch, discussed below. In other embodiments where the deposition of spacer material is compatible with the definable layer 120, the temporary layer 140 can be omitted and the spacer material can be deposited directly on the photo-defined features 124 or the modified photodefined features 124a of the photodefinable layer 120 itself.

In the illustrated embodiment, in addition to having higher heat resistance than photoresist, the material forming the temporary layer 140 is preferably selected such that it can be selectively removed relative to the material for the spacers 175 (FIG. 10) and the underlying etch stop layer 150. As noted above, the layer 140 is preferably formed of amorphous carbon.

Figure 7:
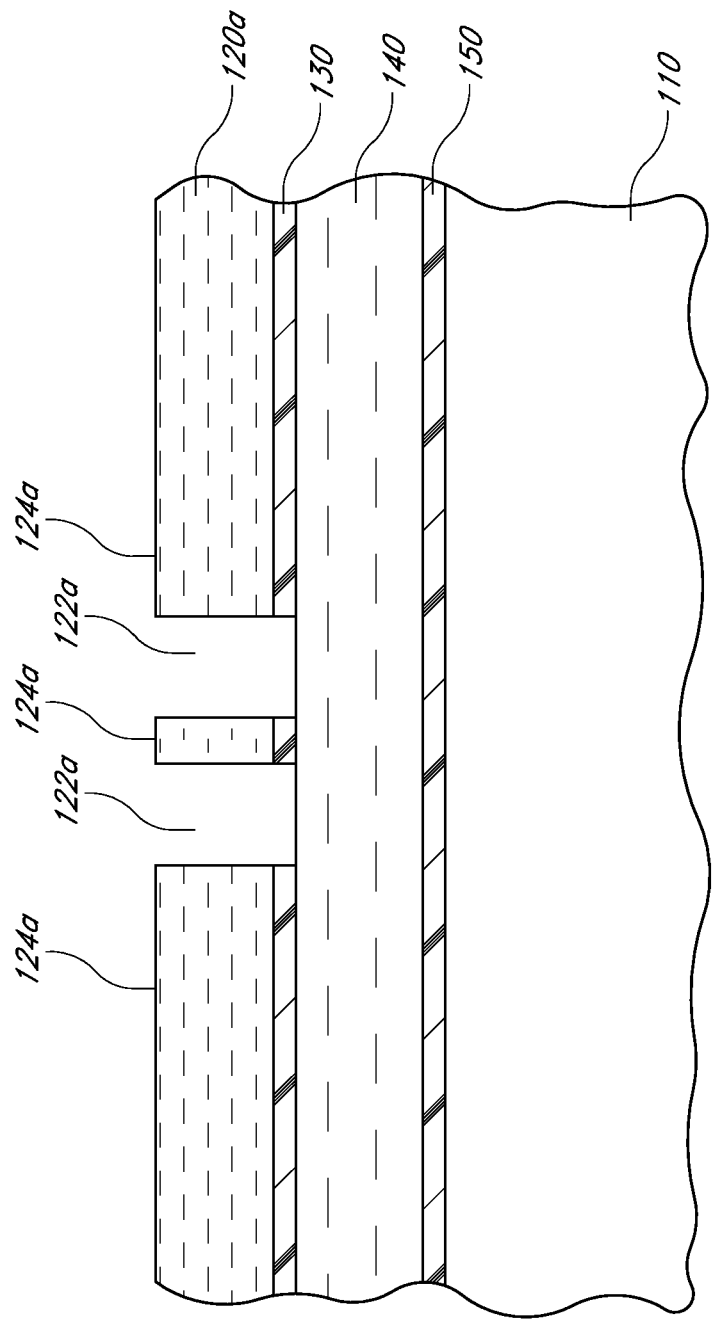
FIG. 7 shows the structure of FIG. 6 after the pattern is transferred to a hard mask layer.

As shown in FIG. 7, the pattern in the modified definable layer 120a is preferably first transferred to the hard mask layer 130. This transfer is preferably accomplished using an anisotropic etch, such as an etch using a fluorocarbon plasma. Preferred fluorocarbon plasma etch chemistries include $CF_4$, $CFH_3$, $CF_2H_2$ and $CF_3H$ for etching the preferred DARC material.

In the illustrated embodiment, a pattern is formed in an overlying layer and later transferred to an underlying layer. In FIG. 7, the illustrated walls of layers 120a and 130 are vertical, where these layers have been etched. Variations in etching processes can alter the precision with which a pattern in an overlying layer corresponds to a pattern created in an underlying layer. Although pattern transfer from layer to layer is generally illustrated schematically to be a precise process, with vertical walls, such precision may be difficult to achieve in practice. Thus, pattern transfer is intended to encompass general correspondence between underlying and overlying patterns. Similarly, pattern transfer is meant to encompass modification of the features originally defining the pattern—for example by enlarging or shrinking those features—where such modification does not change the pitch.

Figure 8:
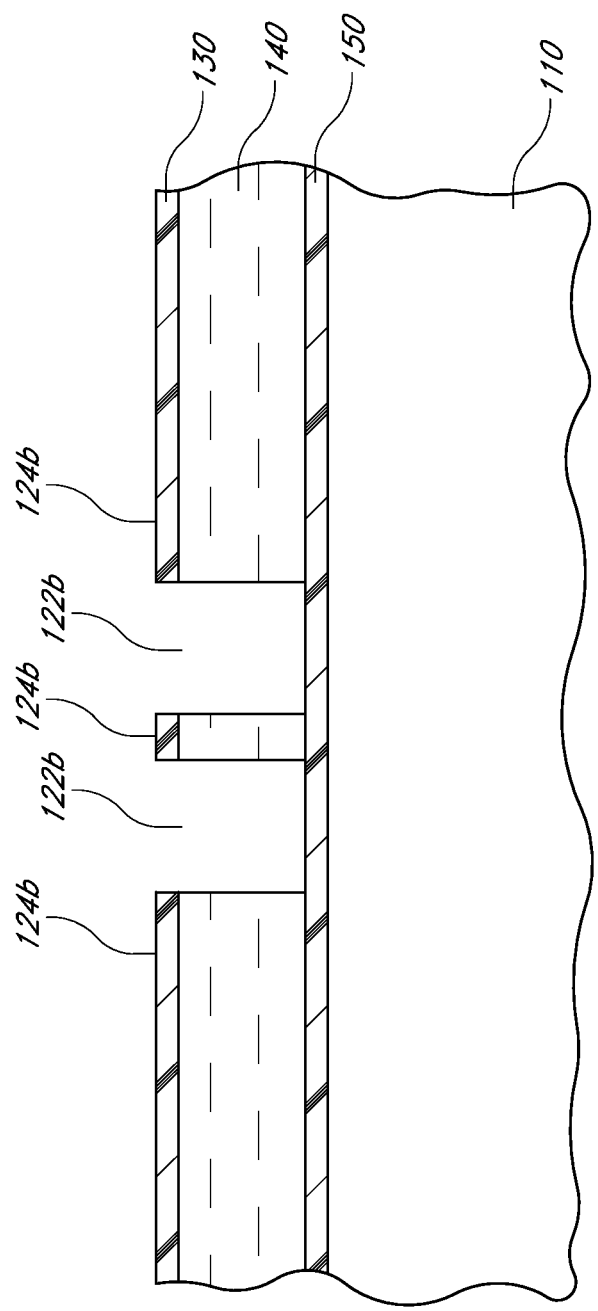
FIG. 8 shows the structure of FIG. 7 after the pattern is transferred to a temporary layer (e.g., a removable hard mask layer).

As shown in FIG. 8, the pattern in the definable layer 120 is then transferred to the temporary layer 140. If the temporary layer 140 is formed from a carbon-based material, this transfer is preferably accomplished using a $SO_2$-containing plasma, e.g., a plasma containing $SO_2$, $O_2$ and Ar. Advantageously, the $SO_2$-containing plasma can etch carbon of the preferred temporary layer 140 at a rate greater than 20 times and, more preferably, greater than 40 times the rate that the hard mask layer 130 and/or the etch stop layer 150 are/is etched. A suitable $SO_2$-containing plasma is described in U.S. patent application Ser. No. 10/931,772 to Abatchev et al., filed Aug. 31, 2004, entitled Critical Dimension Control, the entire disclosure of which is incorporated herein by reference and made part of this specification. The $SO_2$-containing plasma can simultaneously etch the temporary layer 140 and also remove the remaining definable layer 120a. The resulting lines 124b constitute the placeholders or mandrels along which a pattern of spacers 175 (FIG. 10) will be formed.

Various alternative techniques and methods can be used to transfer patterns between layers. For example, instead of, or in addition to, modifying the original features in definable layer 120 with a shrink step, the pattern can be transferred without prior modification into the temporary layer 140. Then a subsequent shrink step can be performed to modify the features in temporary layer 140.

Next, as shown in FIG. 9, a layer 170 of spacer material is preferably blanket deposited so that it conforms to the features of exposed surfaces, including the hard mask layer 130, the hard mask 150 and the sidewalls of the temporary layer 140. Optionally, the hard mask layer 130 can be removed before depositing the layer 170. The spacer material can be any material that can act as a mask for transferring a pattern to the underlying substrate 110, or that otherwise can allow processing of underlying structures through the mask being formed. The spacer material preferably: 1) can be deposited with good step coverage; 2) can be deposited at a temperature compatible with the temporary layer 140; and 3) can be selectively etched relative to the temporary layer 140 and any layer underlying the temporary layer 140. Preferred materials include silicon oxides and nitrides. The spacer material is preferably deposited by chemical vapor deposition or atomic layer deposition. The layer 170 is preferably deposited to a thickness of between about 20-60 nm and, more preferably, about 20-50 nm. Preferably, the step coverage is about 80% or greater and, more preferably, about 90% or greater.

Figure 10:
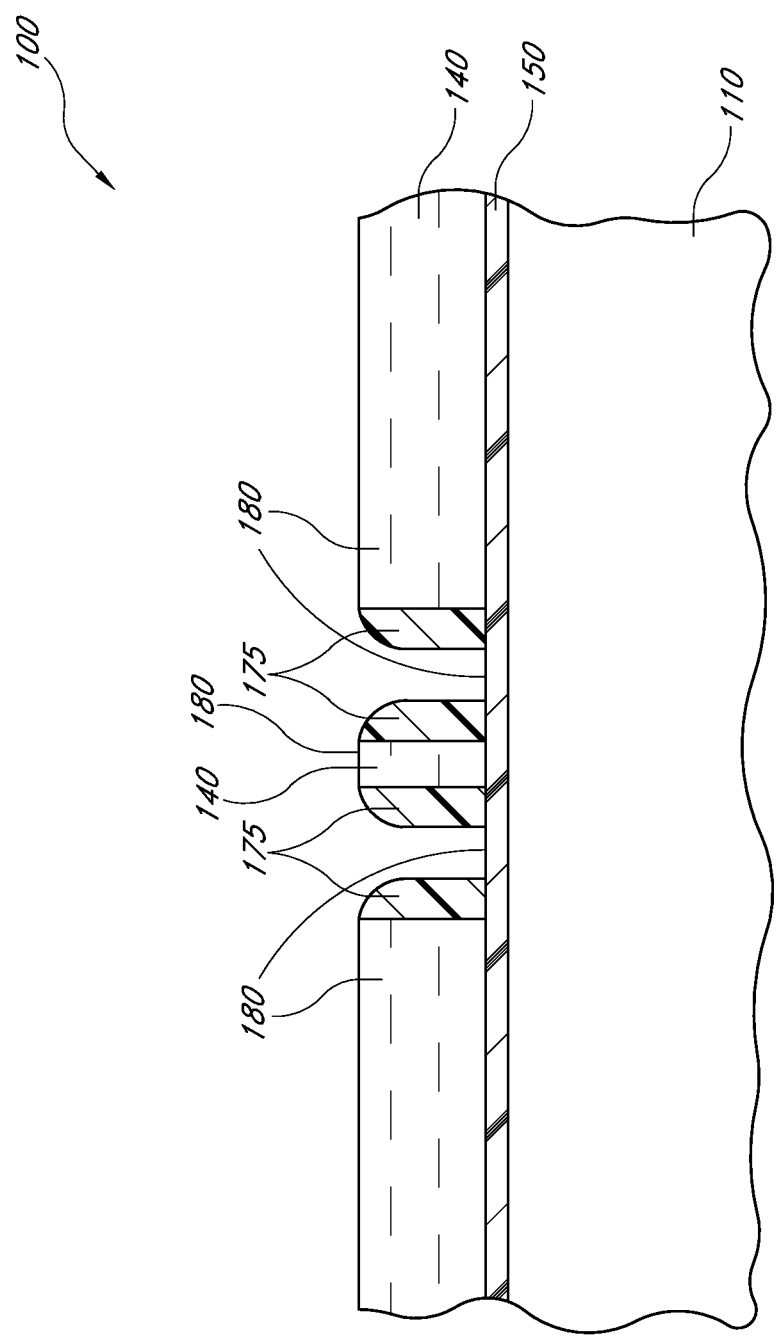
FIG. 10 shows the structure of FIG. 9 after a spacer etch.

As shown in FIG. 10, the spacer layer 170 is then subjected to an anisotropic etch to remove spacer material from horizontal surfaces 180 of the partially formed integrated circuit 100. Such an etch, also known as a spacer etch, can be performed using HBr/Cl plasma for oxide spacer material. A $Cl_2$/HBr can be used to etch silicon. The etch includes a physical component and preferably can also include a chemical component and can be, e.g., a reactive ion etch (RIE), such as a $Cl_2$, HBr etch. Such an etch can be performed, for example, using a LAM TCP9400 flowing about 0-50 sccm $Cl_2$ and about 0-200 sccm HBr at about 7-60 mTorr pressure with about 300-1000 W top power and about 50-250 W bottom power. An AME 5000 device can also accomplish similar etches, although a different recipe and settings may be required. After a spacer etch is performed, it can leave behind a pattern of elongate spacers having effectively reduced pitch relative to the lines.

Figure 11:
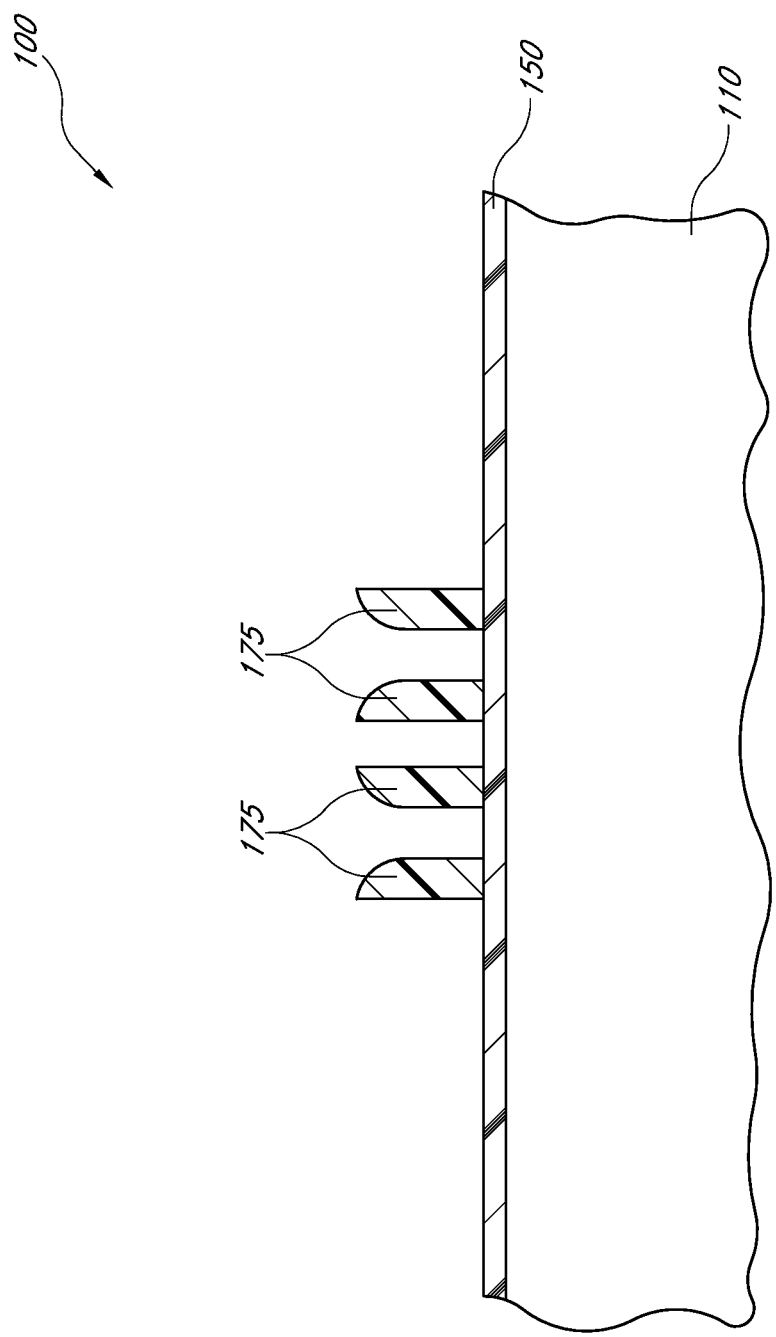
FIG. 11 shows the structure of FIG. 10 after removal of the remaining temporary (e.g., removable hardmask) layer, leaving free-standing spacers.

With reference to FIG. 11, the hard mask layer 130 (if still present) and the temporary layer 140 are next removed to leave freestanding spacers 175. The temporary layer 140 is selectively removed, using, for example, a sulfur-containing plasma etch such as an etch using $SO_2$. Other exemplary etches that can be used to remove the temporary layer 140 as described include an $O_2$ plasma etch or a downstream microwave carbon strip. In this way, features of one pattern are removed to leave behind another pattern formed by the spacers.

Thus, in some embodiments, pitch-reduction has been performed using a spacer material to create masking features. The masking features formed in this way can have a smaller pitch than the photoresist lines and can comprise pitch-reduced masking lines separated by pitch-reduced spaces. Thus, pitch multiplication has been accomplished.

In the illustrated embodiment, the pitch of the spacers 175 is roughly half that of the photoresist lines 124 and spaces 122 (FIG. 5) originally formed by photolithography. Advantageously, spacers 175 having a pitch of about 100 nm or less can be formed. Because the spacers 175 are formed on the sidewalls of the features or lines 124b, the spacers 175 generally form around the periphery, following the outline of the pattern of features or lines 124a in the definable layer 120. Thus, spacers 175 typically form a closed loop, as shown in FIG. 13.

Figure 12:
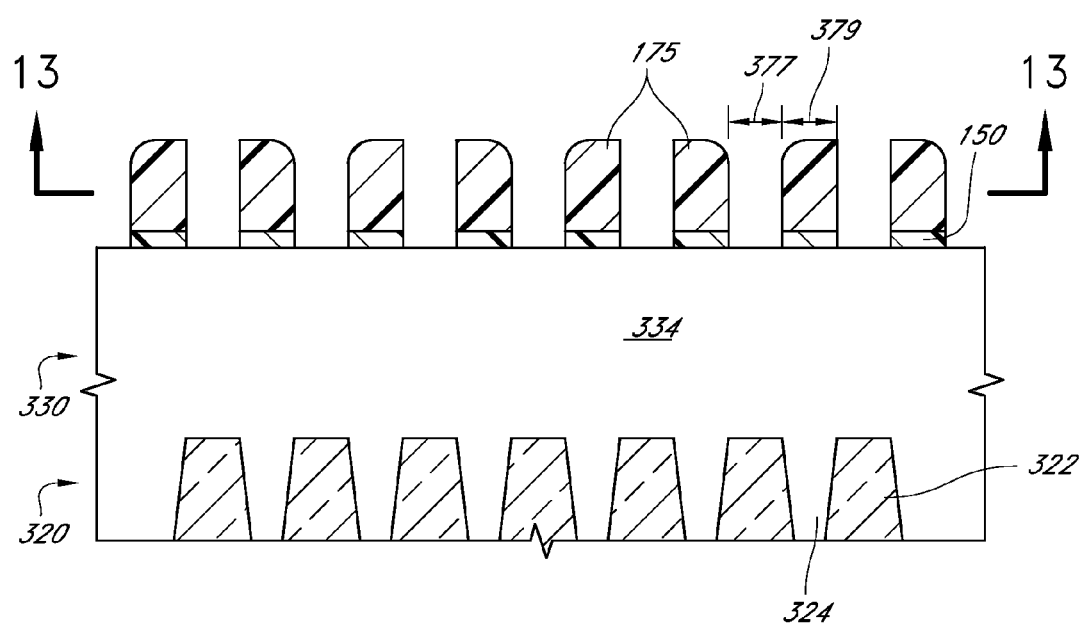
FIG. 12 is a schematic, cross-sectional side view of multiple layers used to form an integrated circuit after spacer formation.

FIG. 12 illustrates an intermediate level 330. The level 330 can be referred to as an ILD, but for convenience, it will be described as a level in itself. The level 330 can be formed from an insulating material 334 having the properties described above in relation to the insulating material 234 of FIG. 2. Furthermore, level 330 can correspond to the upper portion of the substrate 110 shown in FIGS. 4-11. Underlying level 320 can be formed from the materials described above in relation to level 220 of FIG. 2. For example, FIG. 12 shows a plurality of features 322 that correspond to the features 222 shown in FIG. 2. Trenches 324 separate the features 322, just as the trenches 224 separate the features 222. The spacers 175 preferably have a width 379 of approximately 50 nm. Spaces having a width 377 separate the spacers 175. The width 377 is preferably about 50 nm.

The spacers 175 are shown overlying level 330. The spacers are preferably formed according to the methods and configurations described in relation to FIGS. 4-11. In the embodiment of FIG. 12, however, an additional step has been accomplished that was not illustrated in FIG. 11; the spacer pattern has been transferred into the underlying hard mask layer 150. FIG. 12 illustrates that the spacers 175 can be advantageously aligned so that the spaces between them directly overlie the features 322. Thus, the insulating layer is overlaid by one or multiple layers of masking material. In this embodiment, the spacers 175 and corresponding hard mask material 150 comprise the masking material. The spacers 175 are supported by the hard-mask material 150, which can have the properties described in relation to layer 150 of FIGS. 4-11.

Figure 13:
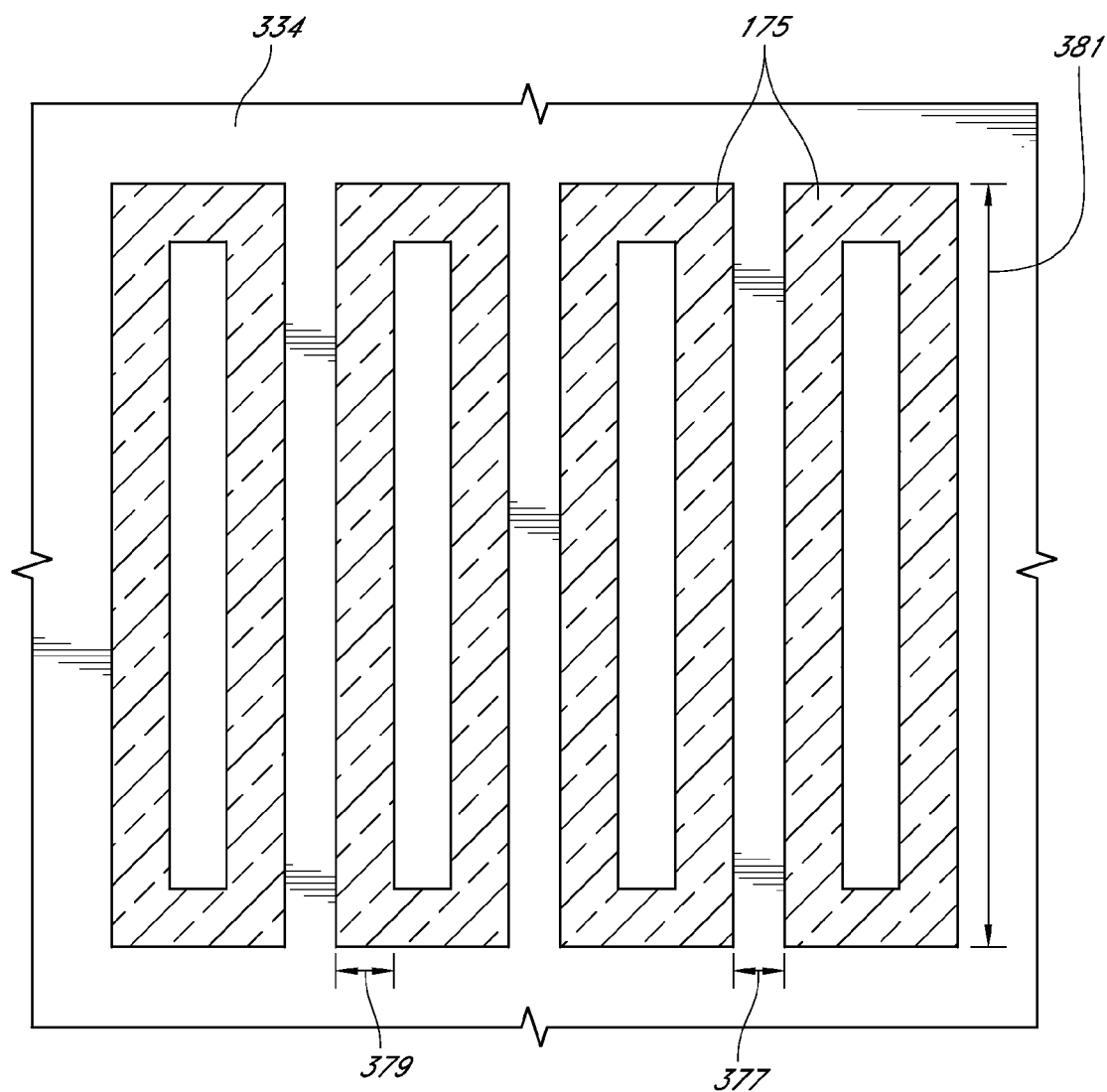
FIG. 13 is a schematic, cross-sectional plan view taken along lines 13-13 of the partially formed integrated circuit of FIG. 12.

FIG. 13 illustrates a cross-sectional plan view taken along lines 13-13 of FIG. 12. The insulating material 334 can be seen underlying and supporting the spacers 175. The spacers 175 can form a mask or a pattern that allows etching steps to affect all the exposed surfaces except those blocked by the spacers 175. The spacers 175 are illustrated schematically, and not necessarily proportionally. For example, spacers can have a length 381. The length 381 is longer than the width 379 of any particular spacer 175 or the width 377 between the spacers 175. Thus, the spacers 175 preferably form loops that are much more elongate, having different proportions than can be shown in FIG. 13. The spacers 175 can extend across the entire footprint of a memory array. The spacers 175 can also be segmented by the desired architecture.

Figure 14A:
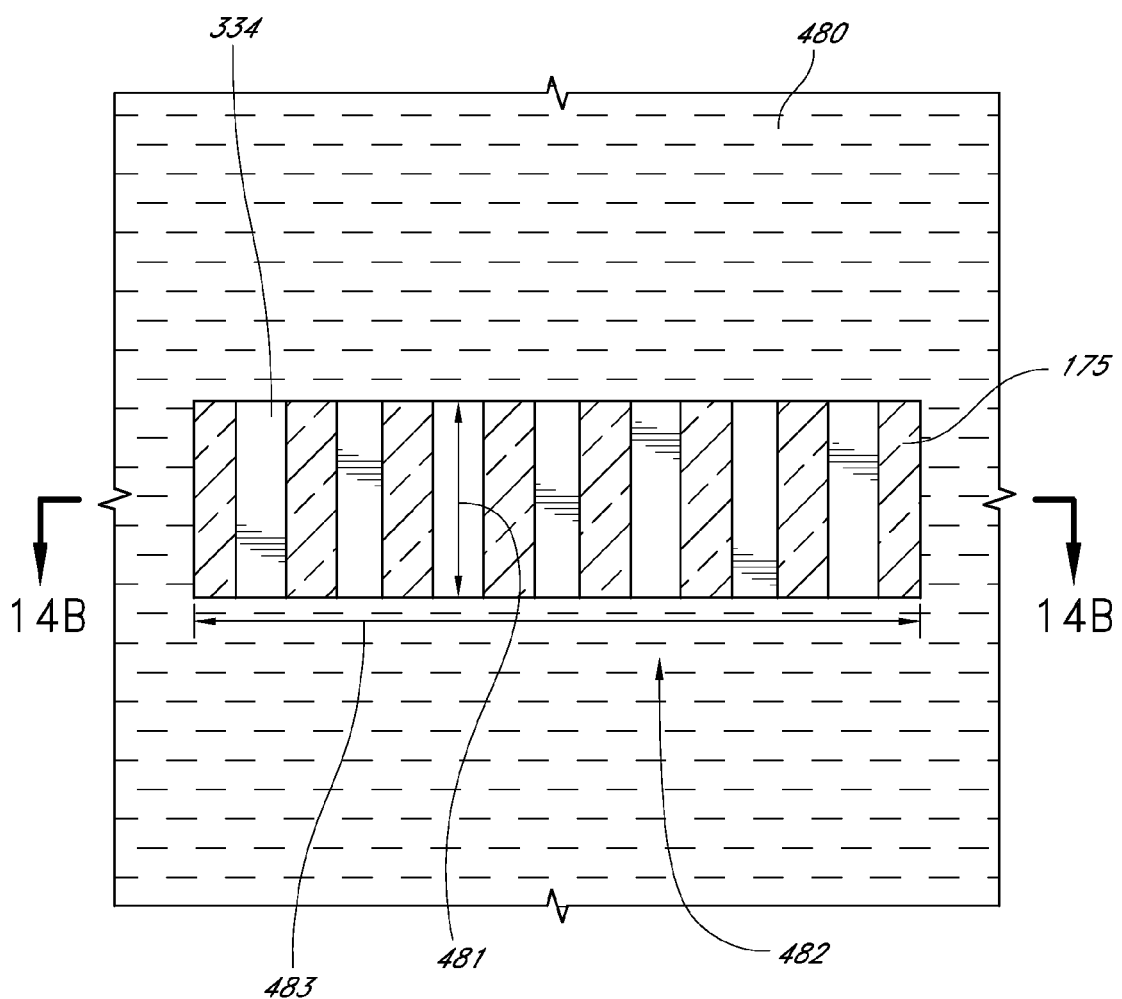
FIG. 14A is a schematic, cross-sectional plan view of the integrated circuit of FIG. 13 after a mask has been applied.

FIG. 14A illustrates a plan view similar to that of FIG. 13, except that a second mask 480 has been deposited (e.g., using a spin-on process) and patterned to partially cover the spacers 175. The second mask 480 and the spacers 175 have been illustrated with hatching for convenience, even though in the view of 14A, the second mask 480 and the spacers 175 are not shown as a cross-section in a single plane. (See FIG. 14B). The second mask 480 defines a window 482 that can be used to define a series of contact vias as explained below. However, in some embodiments, elongate spacers preferably extend the length of an array. Furthermore, in some embodiments, windows such as the window 482 can repeat several times along the length of the memory array. Though only one series of contacts is illustrated in the figures discussed below, second masks in accordance with the disclosed embodiments will preferably include multiple windows for simultaneously etching multiple series of contact vias for the entire array.

As illustrated in FIG. 14A, the second mask 480 and the spacers 175 both shield the underlying insulating material 334. In this way, the second mask 480 and the spacers 175 operate together to effectively form a combined pattern or mask from two superimposed patterns. The window 482 in the second mask 480 has a length 483 and a width 481. The length 483 is long enough to cross multiple spacers in the spacers' pitch-multiplied dimension, preferably across the entire array. In the view of FIG. 14A, the pitch-multiplied dimension is the horizontal dimension extending left and right across the page. The width 481 of window 482, however, is not wide enough to fully expose any of the elongate loops that comprise the spacers 175 as shown in FIG. 13. Preferably, the width 481 is wide enough to be lithographically definable through conventional photolithography. Preferably, neither the width 481 nor the width 483 of window 482 is as short as the critical dimension. In a preferred embodiment, window 482 is fully definable using conventional (as opposed to pitch-multiplied) techniques. Thus, width 481 of window 482 is definable using non pitch-reduced photolithography. For example, in a preferred embodiment, the width 481 is in a range of approximately 100 nm to approximately 200 nm.

The second mask 480 can be formed from a selectively definable layer having the properties described with respect to selectively definable layer 120 of FIG. 4. For example, the second mask 480 is preferably formed of a photoresist.

Some advantageous methods for creating a mask such as the second mask 480 shown in FIG. 14A include applying a crossing pattern of photoresist over a portion of underlying masking features such as the spacers 175. One pattern "crosses" a second pattern when an elongate dimension of the first pattern is not aligned with or parallel to an elongate dimension of the second pattern. For example, because width 483 is longer than width 481, the pattern of second mask 480 can be considered "elongate" in the dimension of width 483. However, because the spacer "loops" 175 of FIG. 13 are longer in the dimension of length 381 (FIG. 13), the pattern of second mask 480 crosses the pattern formed by spacers 175. Advantageously, the illustrated crossing patterns leave multiple portions of pitch-reduced masking features and adjacent pitch-reduced spaces uncovered by the photoresist, as shown here through window 482. Furthermore, inside window 482, the pitch-reduced spaces between the spacers 175 leave an underlying layer 334 exposed. Thus, the second mask 480 can be described as a photolithography mask pattern applied to the spacers 175. The window 482 can be described as an opening in the second mask 480 having an elongate dimension 483 that crosses the pattern of the spacers 175. The elongate dimension of window 482 "crosses" the spacers because it is not parallel to the elongate dimension of the spacers 175. Advantageously, the elongate dimension of window 482 can be parallel to the critical, or pitch-reduced dimension of the spacers 175. Preferably, the elongate dimension of window 482 is perpendicular to the elongate dimension of the spacers 175.

In some advantageous embodiments, the spacer pattern shown in FIG. 13 can be first coated with a planarizing material such as BARC for planarization and anti-reflectivity. For example, the planarizing material can fill the spaces in between the spacers, creating a flat surface overlying the top of the spacers. This hard mask (not shown) can then have a mask with the same pattern as the second mask 480 created on top of it. If the hard mask layer is created, an extra etch step may be required to remove the hard mask material when the time comes. Thus, the pattern of FIG. 14A can be made directly with the selectively definable layer 480, as shown, or the second mask pattern can be transferred to an intervening hard mask layer to arrive at the pattern of FIG. 14A.

Figure 14B:
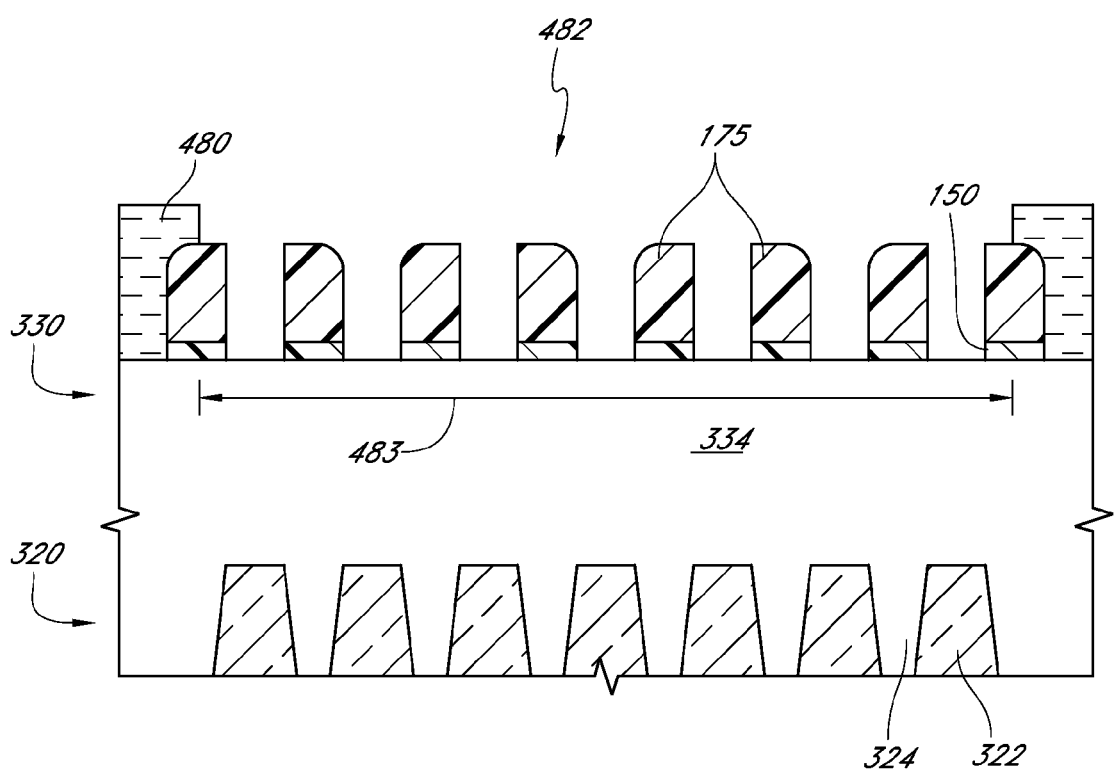
FIG. 14B is a schematic, cross-sectional side view taken along lines 14B-14B of the partially formed integrated circuit of FIG. 14A.

FIG. 14B illustrates a cross section taken along the lines 14B-14B shown in FIG. 14A. The window 482 in the second mask 480 allows the spacers 175 and some of the underlying insulating material 334 to be exposed. The length 483 of the window 482 is also illustrated. This perspective also illustrates how the patterns formed by the second mask 480 and the spacers 175 combine to form an underlying pattern (FIG. 15) that is derived from both overlying patterns.

The combined pattern of the second mask 480 and the spacers 175 can be transferred to an underlying hard-mask layer. Thus, the second mask 480 and the spacers 175 can be used to shield portions of an underlying hard mask layer. If the unshielded portions of the hard mask layer are etched away, the combined pattern has been effectively transferred to the single underlying hard mask layer, such that the second mask 480 and the spacers 175 can be removed prior to etching the substrate. One advantage of such an arrangement is to reduce the effective aspect ratio of the vias during the etch.

Figure 15:
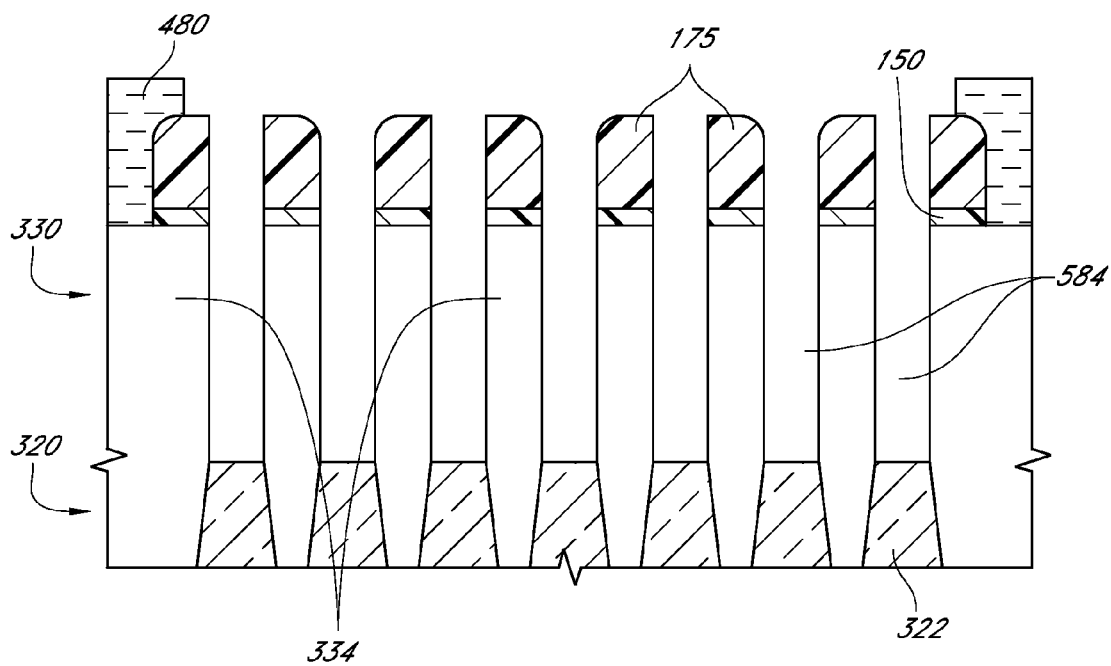
FIG. 15 shows the structure of FIG. 14B after contact vias have been formed.

FIG. 15 is a cross-sectional view showing the vias 584 that have been formed in the insulating material 334. The second mask 480 and the spacers 175 have protected portions of the insulating material 334 from etchant materials, allowing the vias 584 to extend down through the insulating material 334 until the vias 584 reach the features 322. The etch is preferably a directional etch or an anisotropic etch so that the sidewalls of the vias 584 are vertical. The insulating material 334 can comprise BPSG, TEOS, or $SiO_2$, for example. Preferably the etchant material used to create the vias 584 is selective and stops on the features 322.

The vias 584 are preferably configured to receive an electrically conductive material such as metal. Furthermore, the vias 584 are preferably positioned to allow formation of an electrically conductive contact that connects underlying features such as the transistor source regions represented by the features 322 with other components (for example, bit lines) in an overlying level. Thus, the vias 584 can be advantageously formed in an intermediate level 330 after the features 322 have already been formed in an underlying level 320. The intermediate level can be formed from any insulating material.

In the illustrated embodiment, vias 584 were formed in level 330 before spacers and second mask 480 were removed. However, in some embodiments, the second pattern can be transferred to a hard mask layer prior to the etch. Furthermore, both the patterns can be consolidated onto an underlying hard mask prior to the etch. Thus, the resist of the preferred second mask and the spacers can be removed and the hard mask employed to pattern the via etch.

Figure 16:
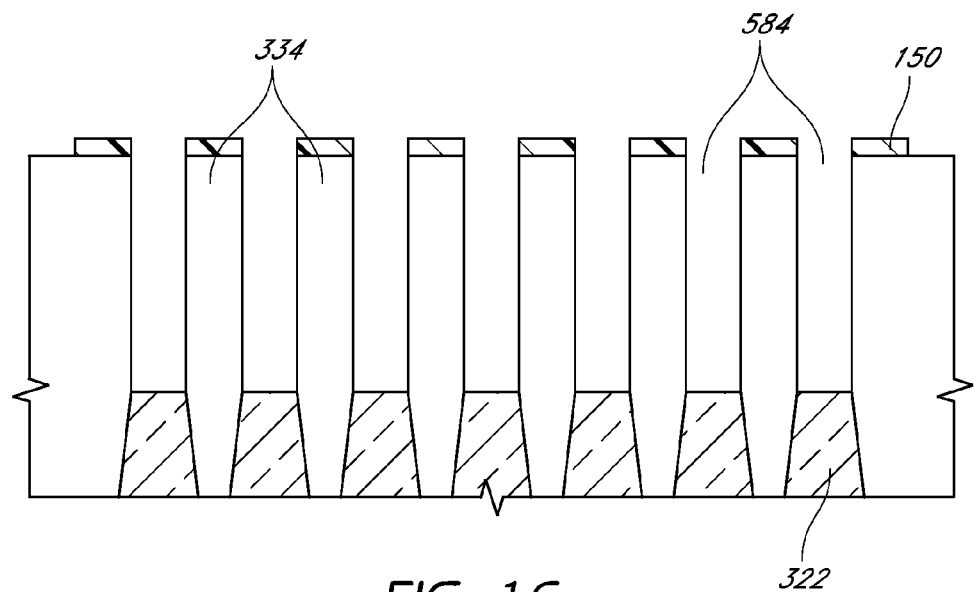
FIG. 16 shows the structure of FIG. 15 after removal of the spacers and overlying mask material.

FIG. 16 is a cross-sectional view of the vias 584 and the insulating material 334 in an alternating pattern. The spacers 175 and the second mask 480 have been removed. Thus, when seen from above, the vias 584 form elongate slots or cavities in the insulating material 334, as will be better understood from FIG. 18B. The slots are elongate in a dimension generally parallel to the pattern of elongate spacers, which have now been removed. The slots are elongate in that dimension because conventional lithography was used to define that dimension. At the bottom of each slot is a feature 322 that is exposed through a corresponding via 584 before the vias 584 have been filled.

Depending on the chemistries involved, the spacers 175 and the second mask 480 can be removed during the via etch or subsequently. For example, photoresist can be stripped with conventional stripping agents or oxygen-based plasma. The remaining masking materials can be removed by selective etching and/or chemical mechanical polishing (CMP). In some embodiments, it is advantageous to remove the photoresist and other masking materials in the same step. The vias can be filled with a conductive material that can be planarized by a CMP etch or a dry etch. If CMP is used, the hard mask layer 150 can act as a CMP stop.

Figure 17:
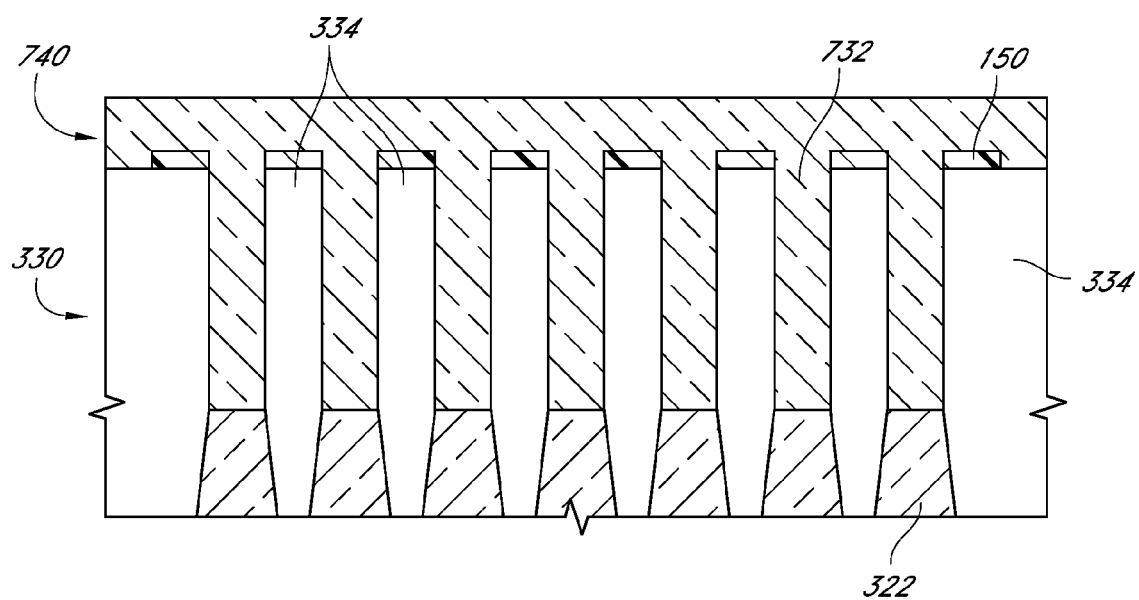
FIG. 17 shows the structure of FIG. 16 after the contact vias have been filled with contact material.

FIG. 17 illustrates the structure shown in FIG. 16 after the vias 584 have been filled with a contact material 732. Preferably, the contact material 732 fills the vias 584 completely. The contact material 732 typically overflows the vias 584 to form an excess layer 740 above the intermediate level 330. The contact material 732 can be any electrically conducting material. In a preferred embodiment, the contact material 732 is doped polysilicon. In some embodiments, the contact material can be a conductive metal such as tungsten, copper, or aluminum, or a metallic compound, such as an alloy, a metal silicide, etc. The contact material often includes multiple layers. For example, a titanium adhesion layer, a metal nitride barrier layer, and a metal filler layer can all be used in combination. Such liner and filler conductive materials can be deposited by any of a variety of methods, depending upon the material. Such methods include CVD, ALD, PVD, electroplating, and related selective processes, such as selective CVD.

Figure 18A:
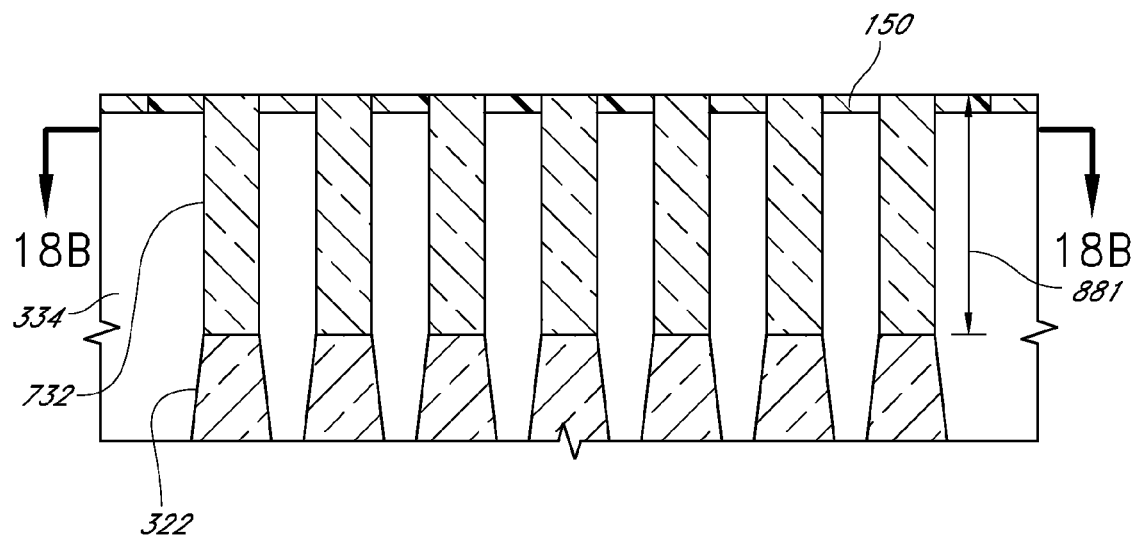
FIG. 18A shows the structure of FIG. 17 after the overflow contact material has been etched away, leaving isolated contacts.

FIG. 18A illustrates a cross-sectional view of a plurality of contacts 732 after the overflow contact material 740 has been etched away. The contacts 732 are advantageously aligned with the features 322 in a one-to-one alignment. Because the contacts 732 have been formed using a spacer process, their critical dimension is compatible with the critical dimension of the features 322.

Figure 18B:
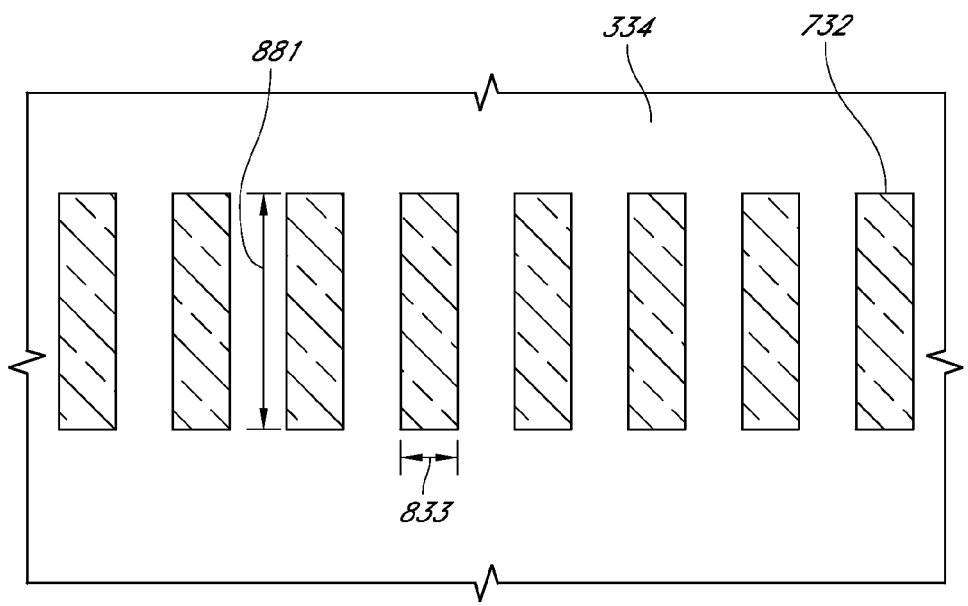
FIG. 18B is a schematic, cross-sectional plan view taken along lines 18B-18B of FIG. 18A.

FIG. 18B illustrates a cross-sectional plan view of the contacts 732. As this figure shows, the contacts 732 are advantageously formed parallel to each other, in a row. The contacts 732 are formed in the elongate slots or cavities described above. Thus, the contacts 732 can be described as elongate conductive features. As is apparent from the details set forth above, the width 833 of each contact 732 is advantageously determined partly by the resolution of a spacer pattern formed using the spacers 175 (FIG. 12). Furthermore, the length 881 of each contact 732 is advantageously determined partly by the resolution of a pattern formed using conventional selectively definable material, such as photoresist.

Figure 19:
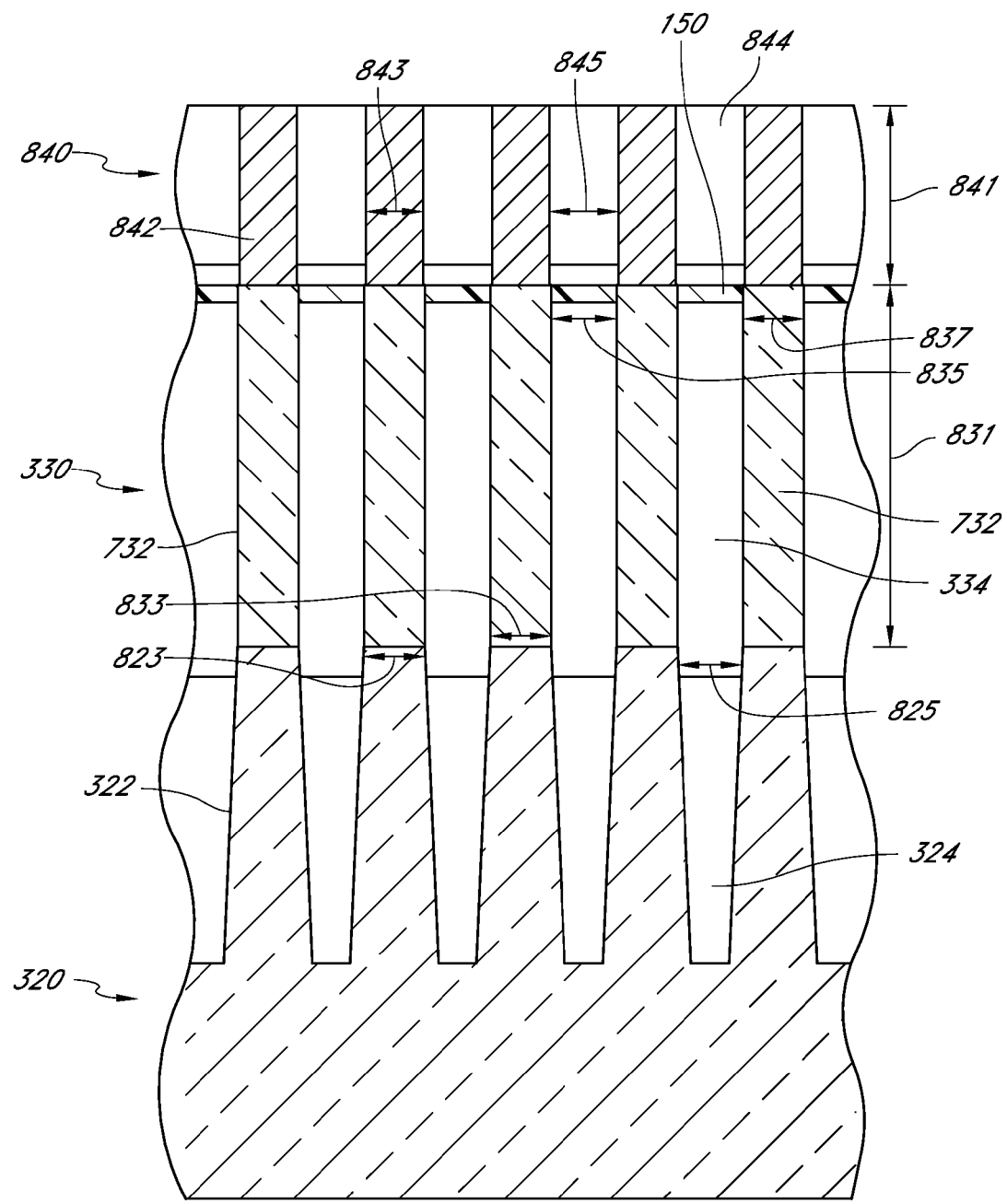
FIG. 19 shows the structure of FIG. 18A after formation of bit lines over and in contact with the contacts formed by the process of FIGS. 4-18B.

FIG. 19 illustrates a portion of an integrated circuit shown in cross-section. In levels 320 and 840, the illustrated characteristics of the integrated circuit are similar to those described above with reference to FIG. 2. However, unlike the contacts 232 of FIG. 2, the contacts 732 match the pitch of the features 322 and overlying bit or digit lines 842 as described further below.

With reference to FIG. 19, in an underlying substrate level 320, the features 322 and trenches 324 advantageously have the characteristics described with respect to features 222 and 322 of FIGS. 2 and 12-17.

With further reference to FIG. 19, an overlying level 840 can include bit or digit lines 842. These lines 842 preferably have the characteristics of the lines 242 of FIG. 2. Similarly, the widths 843 and 845 of the lines 842 and gaps 844 have the characteristics of widths 243 and 245, described in FIG. 2. Furthermore, thickness 841 can have the characteristics of thickness 241 described above and illustrated in FIG. 2.

With further reference to FIG. 19, an intermediate level 330 is located between underlying level 320 and overlying level 840. Advantageously, the intermediate level 330 can have a thickness 831 of less than 1 µm. Preferably, level 330 has a thickness 831 of between 100 nm and 700 nm. In a preferred embodiment, level 330 has a thickness 831 of approximately 500 nm.

The intermediate level 330 includes contacts 732 and insulating material 834. In contrast to the embodiment illustrated in FIG. 2, the contacts 732 preferably do not taper, having approximately the same width at their lower extremity than they do at their upper extremity. Moreover, the contacts 732 of FIG. 19 are thinner. For example, the width 837 at the upper end of the contacts 732 is less than the width 237. Indeed, the width 837 at the upper ends is approximately the same as the width 833 at the lower ends of the contacts 732. The contacts 732 are longer in a dimension that crosses the plane of the cross section shown, so that the cross section illustrates a critical dimension of the contacts 732.

Advantageously, the contacts 732 are formed using a pitch-multiplication process that uses spacer technology to increase feature-density in one dimension. Thus, the contacts 732 have the same pitch width as the features 322. In the cross section of FIG. 19, all five illustrated features 322 abut a corresponding contact 732. In fact, the contacts 732 have similar spacing to that of both the features 322 and the overlying bit or digit lines 842.

In some embodiments, the contacts 732 can have different configurations. For example, the features may have corners that are less sharply-defined than those of the illustrated contacts 732. Furthermore, the proportions, shape, spacing, height, width, and contours of the contacts 732 may vary from the illustration in FIG. 19.

In a preferred embodiment, the contacts 732 are polysilicon plugs. In advantageous embodiments, the contacts 732 connect elements of memory arrays; however, such contacts can connect portions of any electrical device or component to any other electrical device or component.

Furthermore, the contacts 732 preferably have a width 833 at their lower extremity of less than 120 nm. More preferably, width 833 is less than 70 nm. Even more preferably, width 833 is approximately 50 nm. In the future, the width 833 can be reduced below 50 nm.

As described above, contacts 732 preferably have been pitch multiplied in one dimension, whereas in another dimension contact size 732 is more elongate, having been defined through photolithography. Furthermore, as set forth above, such contacts are preferably formed through definition of a pitch-multiplied pattern; creation of windows through conventional photolithography processes; superposition of the windows over the pitch-multiplied pattern; and etching of contact vias through a combined mask that results from the superposition.

Moreover, the principles and advantages discussed herein are applicable to a variety of contexts in which two or more mask patterns having different critical dimensions are combined to form circuit features such as contacts.

Accordingly, it will be appreciated by those skilled in the art that various other omissions, additions and modifications may be made to the methods and structures described above without departing from the scope of the invention. All such modifications and changes are intended to fall within the scope of the invention, as defined by the appended claims.

What is claimed is:

1. A method comprising:
   forming a plurality of lower-level pitch-reduced features, wherein forming the plurality of lower-level pitch-reduced features comprises:
   providing a substrate;
   providing a plurality of lower-level mandrels over the substrate, the mandrels having a length extending along a spacer axis;
   forming lower-level spacers on sidewalls of the lower-level mandrels;
   removing the lower-level mandrels; and
   transferring a pattern formed by the lower-level spacers to the substrate to define the lower-level pitch-reduced features in the substrate;
   depositing a dielectric layer over the lower-level pitch-reduced features;
   forming pitch-reduced spacers having a spacer pitch over the dielectric layer, the spacers elongated substantially along the spacer axis;
   applying a layer of photoresist over the spacers;
   photolithographically defining a crossing pattern of the photoresist over multiple spacers such that opposing sidewalls of each of at least some of the spacers are exposed within a window of the photoresist pattern, the window having a width of less than about 200 nanometers, the width larger than the spacer pitch; and
   etching contact vias in the dielectric layer through a pattern defined by the spacers and the photoresist, wherein the contact vias expose portions of the lower-level pitch-reduced features.

2. The method of claim 1, wherein forming pitch-reduced spacers comprises:
   defining a plurality of spaced-apart lines;
   depositing a layer of spacer material on the lines;
   etching the layer of spacer material to define spacers on sidewalls of the lines; and
   selectively removing the lines relative to the pitch-reduced spacers.

3. The method of claim 2, wherein defining the plurality of spaced-apart lines comprises:
   providing a photoresist layer; and
   photolithographically patterning the photoresist layer to define a photoresist pattern corresponding to the plurality of spaced-part lines.

4. The method of claim 1, wherein applying the crossing pattern of photoresist comprises depositing photoresist on and between the pitch-reduced spacers.

5. The method of claim 1, further comprising transferring a pattern defined by the crossing pattern of photoresist and the pitch-reduced spacers into an underlying layer.

6. The method of claim 5, wherein transferring the pattern comprises etching the underlying layer.

7. The method of claim 6, wherein etching the underlying layer comprises etching an insulator to form contact vias.

8. The method of claim 7, further comprising filling the contact vias to define electrical contacts.

9. A method comprising:
    forming a plurality of lower-level pitch-reduced features in a substrate by pitch multiplication, the lower-level pitch-reduced features elongated along a spacer axis;
    providing an insulating layer over the lower-level pitch-reduced features;
    providing a plurality of mandrels over the insulating layer;
    blanket depositing a layer of spacer material on the mandrels;
    etching the layer of spacer material to define spacers at sidewalls of the lines;
    selectively etching the mandrels relative to the spacers, the spacers having a spacer pitch and elongated substantially along the spacer axis;
    providing a masking pattern over the spacers, the masking pattern comprising a window, the window extending across multiple spacers and exposing opposite sidewalls of each of at least some of the spacers within the window, wherein the window has a width larger than the spacer pitch; and
    forming contact vias in the insulating layer by etching the insulating layer through a combined pattern defined by the spacers and the masking pattern, the contact vias contacting the lower-level pitch-reduced features.

10. The method of claim 9, further comprising filling the contact vias with a conductive material.

11. The method of claim 9, wherein the lower-level pitch-reduced features comprise a plurality of laterally elongated conductive lines in the insulating layer.

12. The method of claim 9, wherein forming contact vias forms electrical components of an integrated circuit.

13. The method of claim 12, wherein the integrated circuit is a memory device.

14. The method of claim 13, wherein the memory device is a flash memory device.

15. The method of claim 9, wherein the mandrels comprise an organic material.

16. The method of claim 15, wherein the organic material is amorphous carbon.

17. The method of claim 9, wherein etching the layer of spacer material comprises anisotropically etching the spacer material.

18. A method comprising:
    forming a plurality of lower-level pitch-reduced features in a substrate by pitch multiplication, the lower-level pitch-reduced features elongated along a spacer axis;
    providing a dielectric layer over the lower-level pitch-reduced features;
    providing free-standing pitch-reduced spacers over the dielectric layer, the spacers separated by a spacer separation width and elongated substantially along the spacer axis;
    providing a layer of masking material over the spacers;
    patterning the layer of masking material to define a window exposing opposite sidewalls of each of at least some of a plurality of the spacers, the window extending across the plurality of spacers, wherein a width of the window is greater than the spacer separation width and the width of the window is less than about 200 nm and larger than the spacer separation width; and
    etching the dielectric layer through a mask defined by the patterned masking material and the exposed spacers, thereby exposing the lower-level pitch-reduced features.

19. The method of claim 18, wherein the width of the window is about 100-200 nm.

20. The method of claim 18, wherein pairs of the spacers define a continuous loop.

* * * * *